United States Patent [19]
Maeda et al.

[11] Patent Number: 6,146,806
[45] Date of Patent: Nov. 14, 2000

[54] NEGATIVE PHOTORESIST COMPOSITION USING POLYMER HAVING 1,2-DIOL STRUCTURE AND PROCESS FOR FORMING PATTERN USING THE SAME

[75] Inventors: Katsumi Maeda; Shigeyuki Iwasa; Kaichiro Nakano; Etsuo Hasegawa, all of Tokyo, Japan

[73] Assignee: NEC Corporation, Tokyo, Japan

[21] Appl. No.: 09/285,730

[22] Filed: Apr. 5, 1999

[30] Foreign Application Priority Data

Apr. 6, 1998 [JP] Japan .................................. 10-093499
Oct. 9, 1998 [JP] Japan .................................. 10-288214

[51] Int. Cl.$^7$ .................................................. G03F 7/004
[52] U.S. Cl. ........................ 430/170; 430/270.1; 430/325; 430/330; 430/910
[58] Field of Search ............................... 430/270.1, 910, 430/325, 330, 170

[56] References Cited

U.S. PATENT DOCUMENTS

| | | | |
|---|---|---|---|
| 4,491,628 | 1/1985 | Ito et al. | 430/176 |
| 5,665,518 | 9/1997 | Maeda et al. | 430/270.1 |
| 5,770,346 | 6/1998 | Iwasa et al. | 430/270.1 |
| 5,851,727 | 12/1998 | Choi et al. | 430/270.1 |
| 6,030,747 | 2/2000 | Nakano et al. | 430/270.1 |

FOREIGN PATENT DOCUMENTS

| | | |
|---|---|---|
| 2-27660 | 6/1990 | Japan . |
| 3-233455 | 10/1991 | Japan . |
| 4-291259 | 10/1992 | Japan . |
| 5-45879 | 2/1993 | Japan . |
| 7-28237 | 1/1995 | Japan . |
| 7-248625 | 9/1995 | Japan . |
| 8-27102 | 1/1996 | Japan . |
| 8-259626 | 10/1996 | Japan . |
| 9-15846 | 1/1997 | Japan . |
| 9-221519 | 8/1997 | Japan . |
| 9-221526 | 8/1997 | Japan . |

OTHER PUBLICATIONS

Hofer, D., et al., "193 nm Photoresist R&D: The Risk & Challenge," Journal of Photopolymer Science and Technology, vol. 9, No. 3, pp. 387–398 (1996).

Thackeray, J., et al., "Deep UV ANR Photoresist for 248 nm Excimer Laser Photolithography," Proceedings of SPIE, vol. 1056, pp. 34–47 (1989).

Takechi, S., et al., "Allcyclic Polymer for ArF and KrF Excimer Resist Based on Chemical Amplification," Journal of Photopolymer Science & Technology, vol. 5, No. 3, pp. 439–446 (1992).

Allen, R.D., et al., "Resolution and ETCH Resistance of a Family of 193 nm Positive Resists," Journal of Photopolymer Science and Technology, vol. 8, No. 4, pp. 623–636 (1995).

Allen, R.D., et al., "Progrees in 193 nm Positive Resists," Journal of Photopolymer Science and Technology, vol. 9, No. 3, pp. 465–474 (1996).

Maeda, K., et al., "Novel Alkaline–Soluble Alicyclic Polymer Poly(TCDMACOOH) for ArF Chemically Amplified Positive Resists," Proceedings of SPIE, vol. 2724, pp. 377–398 (1996).

Crivello, J.V., et al., "A New Preparation of Triarylsulfonium and–selenonium Salts via the Copper (II)–Catalyzed Arylation of Sulfides and Selenides with Diaryliodonium Salts," J. Org. Chem., vol. 43, No. 15, pp. 3055–3058n (1978).

Crivello, J.V., et al., "New Photoinitiators for Cationic Polymerization," J. Polymer Sci., Symposium No. 56, pp. 383–395 (1976).

Houlihan, F.M., "The Synthesis, Characterization and Lithography of a α–Substituted 2–Nitrobenzyl Arylsulfonate Photo–Acid Generators with Improved Resistance to Post Exposure Bake," Proceedings of SPIE, vol. 2195, pp. 137–151 (1994).

Ueno, T., et al., "Chemical Amplification Positive Resist Systems Using Novel Sulfonates as Acid Generators," Proceedings of PME, pp. 413–424 (1989).

Primary Examiner—John S. Chu
Attorney, Agent, or Firm—Foley & Lardner

[57] ABSTRACT

It is an object of the present invention to provide a negative photoresist composition for lithography, using short-wavelength light such as ArF excimer laser beam as a light source.

The negative photoresist composition of the present invention is a negative photoresist composition comprising at least a polymer having a unit represented by the general formula (1)

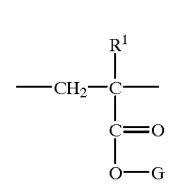

(1)

, a crosslinking agent and a photo-acid generating agent, and the crosslinking agent is capable of crosslinking the polymer in the presence of an acid catalyst, whereby the polymer is insolubilized in a developer. Since the negative resist composition of the present invention is insolubilized in the developer by an action of an acid produced from the photo-acid generating agent at the exposed portion, a negative pattern can be obtained. Since the polymer has not a benzene ring, unlike a base polymer of a conventional negative resist, the polymer has high transparency to ArF excimer laser beam and also has high etching resistance because of its bridged alicyclic group.

10 Claims, 1 Drawing Sheet

NEGATIVE PHOTORESIST COMPOSITION USING POLYMER HAVING 1,2-DIOL STRUCTURE AND PROCESS FOR FORMING PATTERN USING THE SAME

BACKGROUND OF THE INVENTION

1. Field of the Invention

The present invention relates to a technique useful for photolithography in the production of a semiconductor device and, more particularly, to a photoresist material and a negative resist composition, which are suited for lithography using far ultraviolet light of not more than 220 nm, particularly ArF excimer laser beam, as light for exposure, and a process for forming a pattern using the same.

2. Description of the Related Art

In the field of the production of various electronic devices represented by semiconductor device, which requires fine working in the order of half micron, the requirement for higher density and more increased integration of the device has been enhanced. Therefore, the requirement for photolithography for formation of a fine pattern has becomes strict, more and more.

A means for making an attempt to obtain a fine pattern includes, for example, an attempt to shorten the wavelength of light for exposure used in the formation of a pattern using a photoresist. Therefore, in the mass production process of 256 Mbit (working size is not more than 0.25 $\mu$m), the employment of a KrF excimer laser having a shorter wavelength (wavelength: 248 nm) as a light source has been studied in place of i-line (wavelength: 365 nm).

In the production of DRAM having an integration degree of 1 Gbit (working size is not more than 0.18 $\mu$m), which requires a more fine working technique, a light source having a shorter wavelength is required. At present, the employment of photolithography using an ArF excimer laser (193 nm) has been studied [Donald C. Hoffer et al., Journal of Photopolymer Science and Technology, Vol.9 (No.3), pages 387–397 (1996)].

It is necessary that lithography employing excimer laser satisfies an improvement in cost performance of laser because life of a gas as a raw material of laser oscillation is short and a laser apparatus itself is expensive. Therefore, the requirement for higher sensitization is also enhanced, in addition to higher resolution corresponding to an attempt to obtain a fine working size.

As a photoresist having high sensitivity, for example, a chemical amplification type resist employing a photo-acid generating agent as a photosensitive material is well known. A feature of the chemical amplification type resist is that protonic acid generated from a photo-acid generating agent as a constituent component after light exposure causes an acid catalytic reaction to a base resin of the resist during a heat treatment after light exposure. In such way, the photoresist has attained a markedly higher sensitization than that of a conventional resist having a reaction efficacy (reaction per one photon) of smaller than 1. Typical examples of the chemical amplification resist includes a resist comprising a combination of triphenylsulfonium hexafluoroarsenate and poly(p-tert-butoxycarbonyloxy-α-methylstyrene) described in Japanese Patent Kokai Publication No. 27660/1990. As a negative resist, a resist comprising a combination of polyvinylphenol and a melamine derivative of L. E. Bogan et al. is described in Proceeding of SPIE. Vo.1086, pages 34–47 (1989).

As the resist for g-line, i-line or KrF excimer laser, for example, a resin having a benzene ring, such as novolak, polyvinylphenol or the like have been used. However, the resin having a benzene ring exhibits extremely strong light absorption to light having a wavelength of not more than 220 nm, such as ArF excimer laser beam or the like. Therefore, when using these resists in ArF excimer laser lithography, almost all of light for exposure is absorbed on the surface of a thin film. As a result, light for exposure does not penetrate into a substrate so that a fine resist pattern can not be formed. Accordingly, the resin, which has been used in g-line, i-line or KrF excimer laser, can not be applied to photolithography using a light having a short wavelength of not more than 220 nm.

On the other hand, dry etching resistance, which is essential to the resist for production of the semiconductor, has been obtained from the benzene ring in the resin in the case of g-line, i-line or KrF excimer laser. Therefore, a photoresist material, which does not contain the benzene ring and has etching resistance and is transparent to a wavelength of not more than 220 nm, is required as a resist for exposure to ArF excimer laser.

A positive resist, which has transparency to ArF excimer laser beam (193 nm) and has dry etching resistance, has been studied intensively during the past few years. Regarding these resists, a resin having an alicyclic group is used as the base resin. Typical examples thereof include copolymer having an adamantyl methacrylate unit [Journal of Photopolymer Science and Technology], Vol.5 (No.3), pages 439–446 (1992), copolymer having an isobornyl methacrylate unit [R. D. Allen et al., Journal of Photopolymer Science and Technology, Vol.8 (No.4), pages 623–636 (1995), and Vol.9 (No.3), pages 387–397, pages 465–474 (1996)], copolymer having a carboxylated tricyclodecylmethyl methacrylate [Maeda et al., Proceeding of SPIE, Vol.2724, pages 377–398 (1996)] and the like.

However, a methacrylate derivative having an alicyclic group used in the former resin does not have a polar group having substrate adhesion (e.g. carboxyl group, hydroxyl group, etc.). Therefore, a homopolymer of a monomer having an alicyclic group has strong hydrophobicity and poor adhesion with a substrate to be worked (e.g. silicon substrate, etc.) so that it is difficult to form a uniform coated film with good reproductivity. Furthermore, the homopolymer does not have an adamantane-containing residue having dry etching resistance, an isobonyl-containing residue or a residue capable of affording a difference in solubility before and after exposure in a menthyl-containing residue unit and, therefore, a pattern can not be formed by exposure. Accordingly, the former resin can not be employed as the resin component of the resist until the resin is copolymerized with a comonomer capable of affording a difference in solubility, such as t-butyl methacrylate, tetrahydro methacrylate, etc. or a comonomer having substrate adhesion, such as methacrylic acid, etc. However, it is necessary that the content of the comonomer is about 50% by mol and the dry etching resistance of a comonomer unit is drastically low and, therefore, the dry etching resisting effect due to an alicyclic group is drastically lowered, resulting in poor practicality.

As described above, a positive photoresist having both dry etching resistance and high definition has already been known in a photoresist for light having a short wavelength of not more than 220 nm, which is represented by ArF excimer laser lithography. However, a negative photoresist having both dry etching resistance and high definition has never been found out. Therefore, a negative resist which can be employed in lithography using light of not more than 220 nm, such as ArF excimer laser, as light for exposure, that is, a negative resist having both dry etching resistance, definition and substrate adhesion (fine pattern is not easily peeled off from a substrate) for lithography using light of not more than 220 nm, such as ArF excimer laser, as light for exposure is earnestly desired.

Japanese Patent Kokai Publication No. 233455/1991 discloses a negative photoresist composition, Japanese Patent Kokai Publication No. 291259/1992 discloses a resist composition, Japanese Patent Kokai Publication No. 045879/1993 discloses a resist composition and a process for forming a pattern using the same, and Japanese Patent Kokai Publication No. 248625/1995 discloses a radiation-sensitive resin composition, respectively. Furthermore, Japanese Patent Kokai Publication Nos. 259626/1996, 15846/1997, 221519/1997 and 221526/1997 to the present inventors each discloses the related invention.

SUMMARY OF THE INVENTION

The present inventors have studied intensively to attain the object described above. As a result, the present invention has been accomplished. That is, the negative photoresist composition of the present invention comprises:

a polymer having a unit represented by the general formula (1):

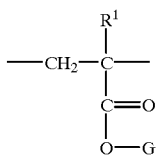

(1)

(in the general formula (1), $R^1$ represents a hydrogen atom or a methyl group, and G represents an alicyclic group having a 1,2-diol structure);

a crosslinking agent of a compound having a functional group represented by the general formula (5):

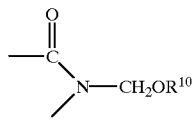

(5)

(in the general formula (5), $R^{10}$ represents a hydrogen atom, an alkyl group having 1 to 6 carbon atoms, or an oxoalkyl group having 3 to 6 carbon atoms); and a photo-acid generating agent capable of generating an acid by exposure.

Furthermore, the process for making a resist pattern of the present invention comprises the steps of forming a layer containing the above negative photoresist composition on a substrate to be worked; exposing the layer to light having a wavelength of 180 to 220 nm according to a desired pattern; baking the exposed one; and developing the baked one, thereby to remove the non-exposed portion from the substrate to be worked.

Furthermore, the (meth)acrylate derivative of the present invention is characterized in that it has the following structure:

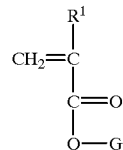

(19)

(in the above formula, $R^1$ represents a hydrogen atom or a methyl group, and G represents an alicyclic group having a 1,2-diol structure represented by the general formula (2) or (3):

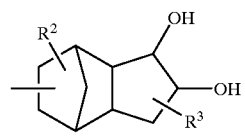

(2)

(in the above formula, $R^2$ and $R^3$ each represent a hydrogen atom or a methyl group); and

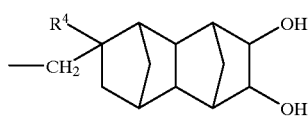

(3)

(in the above formula, $R^1$ represents a hydrogen atom or a methyl group).

Furthermore, the polymer of the present invention is characterized in that it is obtained by copolymerizing the above (meth)acrylate derivatives or the above (meth)acrylate with the other polymerizable compound.

The above polymer is superior in dry etching resistance and transparency and, furthermore, the resist material using the polymer of the present invention is superior in resolution and substrate adhesion so that a fine pattern required for the production of the semiconductor can be formed.

According to the present invention, there can be obtained a negative resist composition which is superior in transparency, and a resist pattern having excellent dry etching resistance and definition which can be obtained by curing the negative photoresist composition. Consequently, it is possible to provide lithography using a short-wavelength light such as ArF excimer laser, particularly a technique which is extremely suited for formation of a fine pattern required in the production of the semiconductor.

BRIEF DESCRIPTION OF THE DRAWINGS (A) to (D) in FIG. 1 are respectively a schematic diagram showing a principal step in the process for forming a resist pattern of the present invention.

DETAILED DESCRIPTION OF THE INVENTION

Figure 1A:
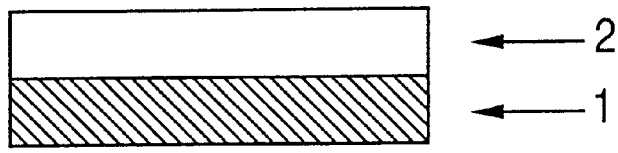

In the general formula (1) showing a structure of a monomer unit of the polymer contained in the composition of the present invention, G represents an alicyclic group having a 1,2-diol structure. Examples of the alicyclic group having a 1,2-diol structure include alicylic groups represented by the following general formulas (2) to (4), and at least one of them can be contained in the polymer.

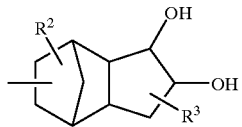

(2)

(in the general formula (2), $R^2$ and $R^3$ each independently represents a hydrogen atom or a methyl group)

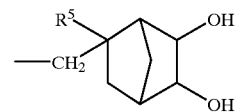

(4)

(in the general formula (4), $R^5$ represents a hydrogen atom or a methyl group)

Particularly preferred specific examples include 3,4-dihydroxytricyclo[$5.2.1.0^{2,6}$]decyl group, 3,4-dihydroxydimethyltricyclo[$5.2.1.0^{2,6}$]decyl group, 3,4-dihydroxytetracyclo[$4.4.0.1^{2,5}.1^{7,10}$]dodecylmethyl group and 3,4-dihydroxy-8-methyltetracyclo[$4.4.0.1^{2,5}.1^{7,10}$] dodecylmethyl group, which are shown in Table 1, and dihydroxyadamantyl group and dihydroxyisobonyl group.

TABLE 1

| G | Chemical structure of group |
|---|---|
| 3,4-dihydroxytricyclo [$5.2.1.0^{2,6}$]decyl group | |
| 3,4-dihydroxy-dimethyltricyclo[$5.2.1.0^{2,6}$]decyl group | |
| 3,4-dihydroxytetracyclo[$4.4.0.1^{2,5}.1^{7,10}$] dodecylmethyl group | |
| 3,4-dihydroxy-8-methyl-tetracyclo[$4.4.0.1^{2,5}.1^{7,10}$]dodecyl methyl group | |
| 2,3-dihydroxy-norbornylmethyl group | |
| 2,3-dihydroxy-5-methyl-5-norbornylmethyl group | |

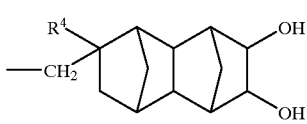

(3)

(in the general formula (3), $R^1$ represents a hydrogen atom or a methyl group)

Thus, two hydroxyl groups are contained in the alicyclic group having a 1,2-diol structure. The hydroxyl group has a property of combining with a crosslinking agent having a functional group represented by the general formula (5) in the presence of an acid catalyst as shown in the following reaction scheme (A). Therefore, the polymer having a 1,2-diol structure and crosslinking agent are crosslinked by an acid, thereby forming a three-dimensional network. As a result, the polymer are insolubilized in a developer. That is, when the photoresist composition comprising a combination of a polymer containing a unit represented by the general formula (1), a crosslinking agent having a functional group represented by the general formula (5) and a photo-acid generating agent of the present invention is formed into a thin film and then exposed to deep UV light such as ArF excimer laser beam, an acid is produced from the photo-acid generating agent in the exposed area and, furthermore, the acid becomes a catalyst by heating and the polymer is crosslinked. As a result, the exposed portion was insolubilized in a developer, thereby making it possible to obtain a negative pattern. Since a group having a 1,2-diol structure has two hydroxyl groups, the degree of crosslinking becomes larger than that of a group which has a monool structure having only one hydroxyl group. Whereby deformation of a pattern originated from poor crosslinking does not easily occurs when using a polymer containing a group having a 1,2-diol structure in the negative resist. Since the polymer having a diol structure has two polar groups having an action of improving substrate adhesion, the formed resist pattern is not easily peeled off from the substrate.

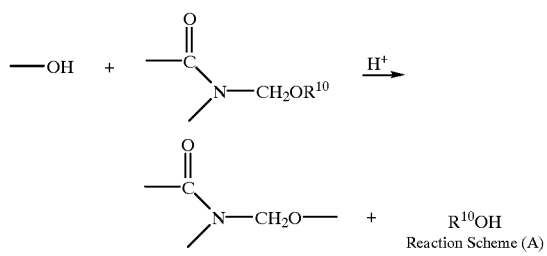

Reaction Scheme (A)

In the present invention, the polymer containing a unit represented by the general formula (1) includes, for example, polymers having a monomer composition represented by each of the general formulas (6) to (8), and at least one of them can be used in the preparation of the composition.

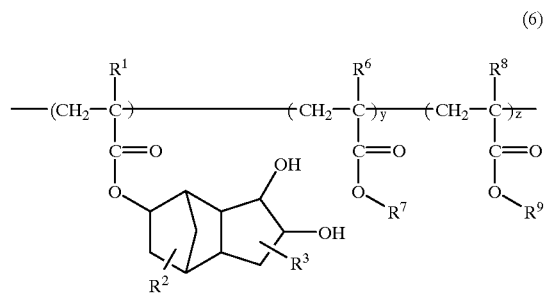

(6)

(in the general formula (6), $R^1$, $R^2$, $R^3$, $R^6$ and $R^8$ each independently represents a hydrogen atom or a methyl group; $R^7$ represents a bridged cyclic hydrocarbon group having 7 to 13 carbon atoms, which has a carboxyl group; $R^9$ represents a hydrogen atom, a hydrocarbon group having 1 to 12 carbon atoms, or a hydrocarbon group having 2 to 12 carbon atoms, which has a hydroxyl group; x, y and z each represents a composition ratio of each unit and is a number satisfying the expressions x+y+z=1, 0<x≦1, 0≦y<1 and 0≦z<1; and a weight-average molecular weight of the polymer is from 2000 to 200000)

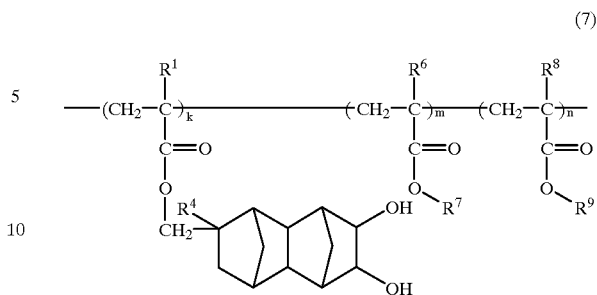

(7)

(in the general formula (7), $R^1$, $R^4$, $R^6$ and $R^8$ each independently represents a hydrogen atom or a methyl group; $R^7$ represents a bridged cyclic hydrocarbon group having 7 to 13 carbon atoms, which has a carboxyl group; $R^9$ represents a hydrogen atom, a hydrocarbon group having 1 to 12 carbon atoms, or a hydrocarbon group having 2 to 12 carbon atoms, which has a hydroxyl group; k, m and n each represents a composition ratio of each unit and is a number satisfying the expressions k+m+n=1, 0<k≦1, 0≦m<1 and 0≦n<1; and a weight-average molecular weight of the polymer is from 2000 to 200000)

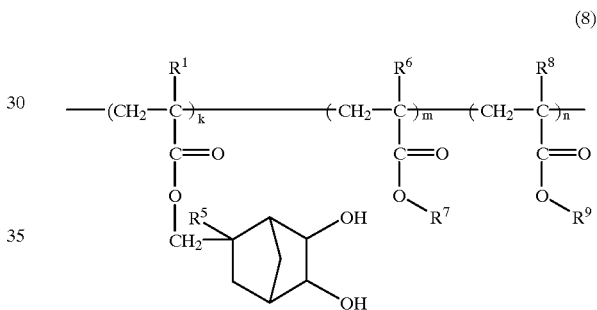

(8)

(in the general formula (8), $R^1$, $R^5$, $R^6$ and $R^8$ each independently represents a hydrogen atom or a methyl group; $R^7$ represents a bridged cyclic hydrocarbon group having 7 to 13 carbon atoms, which has a carboxyl group; $R^9$ represents a hydrogen atom, a hydrocarbon group having 1 to 12 carbon atoms, or a hydrocarbon group having 2 to 12 carbon atoms, which has a hydroxyl group; k, in and n each represents a composition ratio of each unit and is a number satisfying the expressions k+m+n=1, 0<k≦1, 0≦m<1 and 0≦n<1; and a weight-average molecular weight of the polymer is from 2000 to 200000)

The above general formulas (6) to (8) do not represent a repeating unit of a monomer unit, but represents a monomer composition of the polymer, and x, y, z, k, l and m respectively represent a composition ratio of a monomer unit in the whole polymer. That is, the polymer is not limited to only the case where each unit in the above formula forms a predetermined arrangement and may also be, for example, a random or block copolymer of these monomer units. The arrangement of each unit can vary with a polymerization process.

$R^7$ in the above general formulas (6) to (8) is a bridged cyclic hydrocarbon group having 7 to 13 carbon atoms, which has a carboxyl group. Specific examples thereof include carboxytricyclo[5.2.1.0$^{2,6}$]decylmethyl group, carboxytricyclo[5.2.1.0$^{2,6}$]decyl group, carboxyadamantyl group, carboxynorbornyl group, carboxymethylnorbornyl group, carboxyisobornyl group, carboxytetracyclo[4.4.0.1$^{2,}$ s.1$^{7,10}$]dodecyl group, carboxymethyltetracyclo[4.4.0.1$^{2,}$ s.1$^{7,10}$]dodecyl group and the like, but are not limited thereto. It is necessary to dissolve the non-exposed negative photoresist in a developer for patterning. The alicyclic group having a carboxyl group has an action of increasing a dissolution rate of the negative photoresist in the developer. The alicyclic group has an action of improving the dry etching resistance.

R$^9$ is a hydrogen atom, a hydrocarbon group having 1 to 12 carbon atoms, or a hydrocarbon group having 2 to 12 carbon atoms, which has a hydroxyl group. The hydrocarbon group having 1 to 12 carbon atoms includes, for example, methyl group, ethyl group, n-propyl group, isopropyl group, n-butyl group, isobutyl group, t-butyl group, cyclohexyl group, dimethylcyclohexyl group, tricyclo[5.2.1.0$^{2,6}$]decyl group, adamantyl group, norbonyl group, isobornyl group, tetracyclo[4.4.0.1$^{2,5}$.1$^{7,10}$]dodecyl group or the like, but are not limited thereto. The hydrocarbon group having 1 to 12 carbon atoms, which has a hydroxyl group, includes, for example, hydroxyethyl group, hydroxypropyl group, hydroxybutyl group, hydroxycyclohexyl group, hydroxydimethylcyclohexyl group, hydroxytricyclo[5.2.1.0$^{2,6}$]decyl group, hydroxyadamantyl group, hydroxynorbonyl group, hydroxyisobornyl group, hydroxytetracyclo[4.4.0.1$^{2,5}$.1$^{7,10}$] dodecyl group or the like, but are not limited thereto. It is necessary that the base resin of the negative photoresist has good solubility to the developer for resolution of the pattern. The polymer wherein R$^9$ is a hydrogen atom has good solubility to the developer because of carboxyl group (carboxylic acid). When using a hydrocarbon group for R$^9$, the dissolution rate of the polymer can be adjusted to a proper value by changing an incorporation rate of this hydrocarbon group. The hydrocarbon group for R$^9$ is also effective to adjust the glass transition point and hardness of the polymer. When using a hydrocarbon group having 2 to 12 carbon atoms, which has a hydroxyl group for R$^9$, since the reactivity of the hydroxyl group to the crosslinking agent is high, the crosslinking efficacy is increased. Furthermore, the adhesion of the photoresist film to the substrate is improved by the hydroxyl group.

TABLE 2

| R$^7$ | Chemical structure of group |
|---|---|
| Carboxytricyclo[5.2.1.0$^{2,6}$]decylmethyl group | 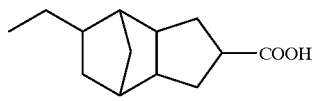 or 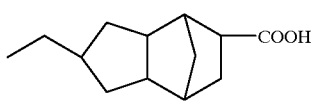 |
| Carboxytricyclo[5.2.1.0$^{2,6}$]decyl group | 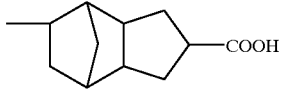 or 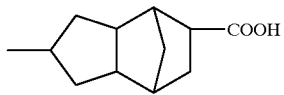 |
| Carboxyadamantyl group | 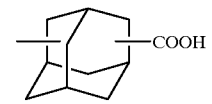 |
| Carboxynorbornyl group |  |
| Carboxymethylnorbornyl group | 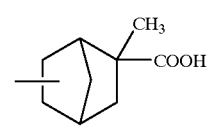 |

TABLE 2-continued

| $R^7$ | Chemical structure of group |
|---|---|
| Carboxyisobornyl group | 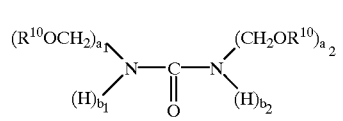 |
| Carboxytetracyclo[4.4.0.1$^{2,5}$.1$^{7,10}$] dodecyl group | |
| Carboxymethyltetracyclo[4.0.0.1$^{2,5}$. 1$^{7,10}$]dodecyl group | |

The polymer containing a unit represented by the general formula (1) of the negative photoresist composition of the present invention can be obtained, for example, by adding a suitable radical polymerization initiator (e.g. azobisisobutyronitrile (AIBN), etc.) in dried tetrahydrofuran under an inert gas (e.g. argon, nitrogen, etc.) atmosphere and stirring with heating at 50–70° C. for 0.5 to 12 hours. Regarding the copolymerization ratio of polymers represented by the general formulas (6) to (8) as the polymer containing a unit represented by the general formula (1), a polymer of an arbitrary copolymerization ratio can be obtained by selecting the polymerization conditions such as charging proportion of the monomer and the like. This process is also described in the specification of Japanese Patent Application No. 093499/1998.

The weight-average molecular weight of the polymer of the negative photoresist composition in the present invention is from 1000 to 500000, and more preferably from 5000 to 200000. When the molecular weight is too low, the glass transition point of the polymer is lowered and it becomes difficult to handle it as the resist. On the other hand, when the molecular weight is too high, it becomes difficult to form a uniform film on the substrate, sometimes.

In the present invention, as the compound containing a group represented by the above general formula (5), there can be used compounds represented by the following general formulas (9) to (12):

(9)

$$(R^{10}OCH_2)_{a_1}\underset{(H)_{b_1}}{\diagdown}N-\underset{\underset{O}{\|}}{C}-N\underset{(H)_{b_2}}{\diagup}(CH_2OR^{10})_{a_2}$$

(in the general formula (9), $R^{10}$ represents a hydrogen atom, an alkyl group having 1 to 6 carbon atoms (specific examples thereof include methyl group, ethyl group, propyl group, isopropyl group, butyl group, isobutyl group, tert-butyl group, pentyl group, hexyl group, etc. but are not limited thereto), or an oxoalkyl group having 3 to 6 carbon atoms (specific examples thereof include β-oxopropyl group, β-oxobutyl group, β-oxoheptyl group, β-oxohexyl group, etc. but are not limited thereto); $a_1$ is 1 or 2; $a_2$ is 1 or 2; $b_1$ is 0 or 1; and $b_2$ is 0 or 1; with the proviso that $a_1+b_1=2$, $a_2+b_2=2$);

(10)

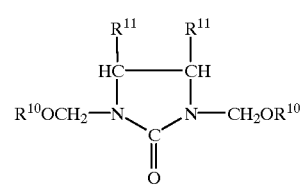

(in the general formula (10), $R^{10}$ represents a hydrogen atom, an alkyl group having 1 to 6 carbon atoms (specific examples thereof include methyl group, ethyl group, propyl group, isopropyl group, butyl group, isobutyl group, tert-butyl group, pentyl group, hexyl group, etc. but are not limited thereto), or an oxoalkyl group having 3 to 6 carbon atoms (specific examples thereof include β-oxopropyl group, β-oxobutyl group, β-oxoheptyl group, β-oxohexyl group, etc. but are not limited thereto); and $R^{11}$ represents a hydrogen atom, a hydroxyl group, an alkoxy group having 1 to 6 carbon atoms (specific examples thereof include methoxy group, ethoxy group, propoxy group, isopropyloxy group, butoxy group, isobutoxy group, tert-butoxy group, pentyloxy group, hexyloxy group, etc. but are not limited thereto), or an oxoalkyloxy group having 3 to 6 carbon atoms (specific examples thereof include β-oxopropoxy group, β-oxobutoxy group, β-oxoheptyloxy group, β-oxohexyloxy group, etc. but are not limited thereto);

(11)

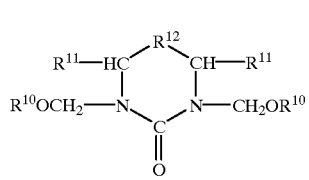

(in the general formula (11), $R^{10}$ represents a hydrogen atom, an alkyl group having 1 to 6 carbon atoms (specific examples thereof include methyl group, ethyl group, propyl group, isopropyl group, butyl group, isobutyl group, tert-butyl group, pentyl group, hexyl group, etc. but are not limited thereto), or an oxoalkyl group having 3 to 6 carbon atoms (specific examples thereof include β-oxopropyl group, β-oxobutyl group, β-oxoheptyl group, β-oxohexyl group, etc. but are not limited thereto); $R^{11}$ represents a hydrogen atom, a hydroxyl group, an alkoxy group having 1 to 6 carbon atoms (specific examples thereof include methoxy group, ethoxy group, propoxy group, isopropyloxy group, butoxy group, isobutoxy group, tert-butoxy group, pentyloxy group, hexyloxy group, etc. but are not limited thereto), or an oxoalkyloxy group having 3 to 6 carbon atoms (specific examples thereof include β-oxopropoxy group, β-oxobutoxy group, β-oxoheptyloxy group, β-oxohexyloxy group, etc. but are not limited thereto); and $R^{12}$ represents an oxygen atom, a sulfur atom, an alkylene group having 1 to 3 (specific examples thereof include methylene group, ethylene group, propylene group, 1-methylethylene group, etc. but are not limited thereto), or a hydroxymethylene group); and

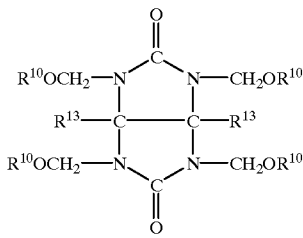

(12)

(in the general formula (12), $R^{10}$ represents a hydrogen atom, an alkyl group having 1 to 6 carbon atoms (specific examples thereof include methyl group, ethyl group, propyl group, isopropyl group, butyl group, isobutyl group, tert-butyl group, pentyl group, hexyl group, etc. but are not limited thereto), or an oxoalkyl group having 3 to 6 carbon atoms (specific examples thereof include β-oxopropyl group, β-oxobutyl group, β-oxoheptyl group, β-oxohexyl group, etc. but are not limited thereto); and $R^{13}$ represents a hydrogen atom or a methyl group or ethyl group).

In the compound represented by the general formula (9) as the crosslinking agent of the negative photoresist composition of the present invention, methylolurea wherein $R^{10}$ is a hydrogen atom can be synthesized, for example, by converting urea into methylol using formaldehyde. The compound of the general formula (9) wherein $R^{10}$ is an alkyl group or an oxoalkyl group can be obtained by treating methylolurea with a corresponding alcohol.

For example, dimethylated methylolyurea [those of the general formula (9) wherein $R^{10}$ is a methyl group (alkyl group having 1 carbon atom)] is obtained by treating with methanol, diethylated methylolyurea [those of the general formula (9) wherein $R^{10}$ is an ethyl group (alkyl group having 2 carbon atoms)] is obtained by treating with ethanol, diisobutylated methylolyurea [those of the general formula (9) wherein $R^{10}$ is an isobutyl group (alkyl group having 4 carbon atoms)] is obtained by treating with isobutanol, and di-β-oxopropylated methylolyurea [those of the general formula (9) wherein $R^{10}$ is a β-oxopropyl group (oxoalkyl group having 3 carbon atoms)] is obtained by treating with 2-oxopropanol (another name: hydroxyacetone), respectively.

In the compound represented by the general formula (10), 1,3-bis(hydroxymethyl)ethyleneurea wherein $R^{10}$ is a hydrogen atom and $R^{11}$ is a hydrogen atom (another name: 1,3-dumethylolimidazolidone-2) of the general formula (10) can be obtained, for example, by reacting urea, ethylenediamine and formaldehyde. The compound of the general formula (10) wherein $R^{10}$ is an alkyl group or an oxoalkyl group and $R^{11}$ is a hydrogen atom can be obtained by treating 1,3-bis(hydroxymethyl)ethyleneurea with a corresponding alcohol.

For example, 1,3-bis(methoxymethyl)ethyleneurea [those of the general formula (10) wherein $R^{10}$ is a methyl group (alkyl group having 1 carbon atom) and $R^{11}$ is a hydrogen atom] is obtained by treating with methanol, 1,3-bis(ethoxymethyl)ethyleneurea [those of the general formula (10) wherein $R^{10}$ is an ethyl group (alkyl group having 2 carbon atoms) and $R^{11}$ is a hydrogen atom] is obtained by treating with ethanol, 3-bis(isobutoxymethyl)ethyleneurea [those of the general formula (10) wherein $R^{10}$ is an isobutyl group (alkyl group having 4 carbon atoms) and $R^{11}$ is a hydrogen atom] is obtained by treating with isobutanol, and 1,3-bis(β-oxopropoxymethyl)ethyleneurea [those of the general formula (10) wherein $R^{10}$ is a 2-oxopropyl group (oxoalkyl group having 3 carbon atoms) and $R^{11}$ is a hydrogen atom] is obtained by treating with 2-oxopropanol (another name: hydroxyacetone), respectively.

1,3-bis(hydroxymethyl)-4, 5-bis(hydroxy)ethyleneurea of the general formula (10) wherein $R^{10}$ is a hydrogen atom and $R^{11}$ is a hydroxyl group (another name: 1,3-dumethylol-4, 5dihydroxyimidazolidone-2) can be obtained, for example, by reacting urea with glyoxazole and converting the reaction product into methylol using formaldehyde. The compound of the general formula (10) wherein $R^{10}$ is an alkyl group or an oxoalkyl group and $R^{11}$ is an alkoxy group or an oxoalkoxy group can be obtained by treating 1,3 -bis (hydroxymethyl)-4,5-bis(hydroxy)ethyleneurea with a corresponding alcohol.

For example, 1,3-bis(methoxymethyl)-4,5-bis(methoxy) ethyleneurea [those of the general formula (10) wherein $R^{10}$ is a methyl group (alkyl group having 1 carbon atom) and $R^{11}$ is a methoxy group (alkoxy group having 1 carbon atom)] is obtained by treating with methanol, 1,3-bis (ethoxymethyl)-4,5-bis(ethoxy)ethyleneurea [those of the general formula (10) wherein $R^{10}$ is an ethyl group (alkyl group having 2 carbon atoms) and $R^{11}$ is an ethoxy group (alkoxy group having 2 carbon atoms] is obtained by treating with ethanol, 1,3-bis(isopropoxymethyl)-4,5-bis (isopropoxy)ethyleneurea [those of the general formula (10) wherein $R^{10}$ is an isopropyl group (alkyl group having 4 carbon atoms) and $R^{11}$ is a propyloxy group (alkoxy group having 3 carbon atoms] is obtained by treating with isopropanol, 1,3-bis(tert-butoxymethyl)-4,5-bis(tert-butoxy) ethyleneurea [those of the general formula (5) wherein $R^{10}$ is a tert-butyl group (alkyl group having 4 carbon atoms) and $R^{11}$ is a tert-butoxy group (alkoxy group having 4 carbon atoms] is obtained by treating with tert-butanol, and 1,3-bis (β-oxopropoxymethyl)-4,5-bis(β-oxopropoxy)ethyleneurea [those of the general formula (10) wherein $R^{10}$ is a β-oxopropyl group (oxoalkyl group having 3 carbon atoms) and $R^{11}$ is a β-oxopropyloxy group (oxoalkoxy group having 3 carbon atoms] is obtained by treating with 2-oxopropanol (another name: hydroxyacetone), respectively.

In the case of the compound represented by the general formula (11), 1,3-bis(hydroxymethyl)-tetrahydro-2(1H) pyrimidinone of the general formula (11) wherein $R^{10}$ and $R^{11}$ are respectively a hydrogen atom and $R^{12}$ is a methylene group can be obtained, for example, by reacting urea with propylenediamine and reacting the reaction product with formaldehyde. The compound of the general formula (11) wherein $R^{10}$ is an alkyl group, $R^{11}$ is a hydrogen atom and $R^{12}$ is a methylene group can be obtained by treating 1,3-bis(hydroxymethyl)-tetrahydro-2(1H)pyrimidinone with a corresponding alcohol.

For example, dimethylated 1,3-bis(hydroxymethyl)-terahydro-2(1H)pyrimidinone [those of the general formula

(11) wherein $R^{10}$ is a methyl group (alkyl group having 1 carbon atom), $R^{11}$ is a hydrogen atom and $R^{12}$ is a methylene group (alkylene group having 1 carbon atom)] is obtained by treating with methanol, diethylated 1,3-bis(ethoxymethyl)-tetrahydro-2(1H)pyrimidinone [those of the general formula (11) wherein $R^{10}$ is an ethyl group (alkyl group having 2 carbon atoms), $R^{11}$ is a hydrogen atom and $R^{12}$ is a methylene group (alkylene group having 1 carbon atom)] is obtained by treating with ethanol, and butylated 1,3-bis (hydroxymethyl)-tetrahydro-2(1H) pyrimidinone[those of the general formula (11) wherein $R^{10}$ is an isobutyl group (alkyl group having 4 carbon atoms), $R^{11}$ is a hydrogen atom and $R^{12}$ is a methylene group (alkylene group having 1 carbon atom)] is obtained by treating with isobutanol.

Dimethyloluron of the general formula (11) wherein $R^{10}$ and $R^{11}$ are respectively a hydrogen atom and $R^{12}$ is an oxygen atom can be obtained, for example, by reacting urea with a 4-fold molar amount of formaldehyde. In addition, 1,3-bis(hydroxymethyl)-tetrahydro-5-hydroxy-2(1H) pyrimidinone wherein $R^{10}$ and $R^{11}$ are respectively a hydrogen atom and $R^{12}$ is a hydroxymethylene group can be obtained, for example, by reacting urea with 2-hydroxypropylenediamine and reacting the reaction product with formaldehyde.

In the case of the compound represented by the general formula (12), 1,3,4,6-tetrakis(hydroxymethyl)glycol uryl of the general formula (12) wherein $R^{10}$ is a hydrogen atom and $R^{13}$ is a hydrogen atom (another name: 1,3,4,6-tetrakis (hydroxymethyl)acetylene urea, tetramethyloled gleoxazole diureine) can be synthesized by reacting glyoxazole with a two-fold molar amount and converting the reaction product into methylol using formamide. In addition, the compound of the general formula (12) wherein $R^{10}$ is an alkyl group or an oxoalkyl group and $R^{13}$ is a hydrogen atom can be obtained by treating 1,3,4,6-tetrakis(hydroxymethyl)glycol uryl with a corresponding alcohol.

For example, 1,3,4,6-tetrakis(methoxymethyl)glycol uryl [those of the general formula (12) wherein $R^{10}$ is a methyl group (alkyl group having 1 carbon atom) and $R^{13}$ is a hydrogen atom] is obtained by treating with methanol, 1,3,4,6-tetrakis(ethoxymethyl)glycol uryl [those of the general formula (12) wherein $R^{10}$ is an ethyl group (alkyl group having 2 carbon atoms) and $R^{13}$ is a hydrogen atom] is obtained by treating with ethanol, 1,3,4,6-tetrakis (isobutoxymethyl)glycol uryl [those of the general formula (12) wherein $R^8$ is an isobutyl group (alkyl group having 4 carbon atoms) and $R^{13}$ is a hydrogen atom] is obtained by treating with isobutanol, and 1,3,4,6-tetrakis(β-oxopropoxymethyl) glycol uryl [those of the general formula (12) wherein $R^{10}$ is a β-oxopropyl group (oxoalkyl group having 3 carbon atoms and R13 is a hydrogen atom] is obtained by treating with 2-oxopropanol (another name: hydroxyacetone).

The photo-acid generating agent of the resist composition of the present invention is preferably a photo-acid generating agent capable of generating an acid by exposure to light of 180–220 nm, and may be any photo-acid generating agent as far as a mixture of the aforementioned resist composition of the present invention and the photo-acid generating agent dissolves sufficiently in an organic solvent and the resulting solution thereof can form a uniform coated film by a film-forming process such as spin coating or the like. The photo-acid generating agents may be used alone, or two or more kinds of them may be used in combination. As the photo-acid generating agent which can be used, for example, there can be used sulfonium salt compound represented by the general formula (14), iodonium salt compound represented by the general formula (16), succinimide derivative represented by the general formula (17), diazo compound represented by the general formula (18), 2,6-dinitrobenzyl esters, and disulfone compound. Examples thereof include alkyl sulfonium salt derivative such as triphenyl sulfonium salt derivative of J. V Crivello et al. described in Journal of the Organic Chemistry, Vo.43, No.15, pages 3055–3058 (1978), diphenyl iodonium salt derivative of J. V Crivello et al. described in Journal of the Polymer Science, Vo.56, pages 383–395 (1976), cyclohexylmethyl(2-oxocyclohexyl) sulfonium trisulfomethane sulfonate disclosed in Japanese Patent Kokai Publication No. 28237/1995, and sulfonium salt compound having a bridged cyclic alkyl group such as β-oxocyclohexylmethyl(2-norbornyl)sulfonium trifluoromethanesulfonate disclosed in Japanese Patent Kokai Publication No. 27102/1996. The photo-acid generating agent further includes, for example, 2,6-dinitrobenzyl esters [O. Nalamasu et al., Proceeding of SPIE, Vol.1262, page 32 (1990)], 1,2,3-tri(methanesulfonyloxy)benzene [Takumi UENO et al., Proceeding of PME'89, Kodan-sha, pages 413–424 (1990)], disulfone compound or the like.

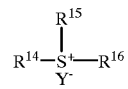

(14)

[in the general formula (14), $R^{14}$, $R^{15}$ and $R^{16}$ each independently represents an alkyl-substituted, halogen-substituted or non-substituted aromatic group, an alicyclic group, a bridged cyclic hydrocarbon group, a 2-oxo alicyclic group or an alkyl group; and Y represents $BF_4^-$, $AsF_6^-$, $SbF_6^-$ or a counter ion represented by the formula (15): $Z\text{—}SO_3^-$ (in the formula (15), Z represents $C_nF_{2n+1}$ (n is an integer of 1 to 6), an alkyl group, or an alkyl-substituted, halogen-substituted or non-substituted aromatic group)]

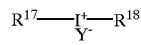

(16)

[in the general formula (16), $R^{17}$ and $R^{18}$ each independently represents an alkyl-substituted, halogen-substituted or non-substituted aromatic group, an alicyclic group, a bridged cyclic hydrocarbon group, a 2-oxo alicyclic group or an alkyl group; and ⁻ represents $BF_4^-$, $AsF_6^-$, $SbF_6^-$ or a counter ion represented by the above formula (15)]

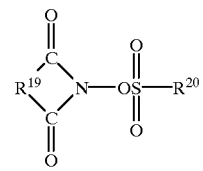

(17)

[in the general formula (17), $R^{19}$ represents a halogen-substituted or non-substituted alkylene group, or an alkyl-substituted, halogen-substituted or non-substituted divalent aromatic group; and $R^{20}$ represents a halogen-substituted or non-substituted alkyl group, an alkyl group, or a halogen-substituted or non-substituted aromatic group]

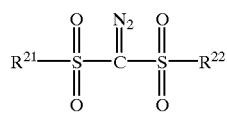

(18)

[in the general formula (18), $R^{21}$ and $R^{22}$ each independently an alkyl group, an alkyl-substituted, halogen-substituted or non-substituted aromatic group, an alkyl group, an alicyclic hydrocarbon group or a bridged cyclic hydrocarbon group]

When a polyhydric alcohol (di- or polyhydric alcohol) is contained in the negative photoresist composition of the present invention, the definition is sometimes improved. This is because the polyhydric alcohol having high reactivity with the crosslinking agent acts as a crosslinking accelerator. The polyhydric alcohol used in the present invention includes, for example, ethylene glycol, glycerol, 1,2-butanediol, 1,3-butanediol, 1,4-butanediol, 2,3-butanediol, 1,2,4-butanediol, 1,2-pentanediol, 1,4-pentanediol, 1,5-pentanediol, 2,4-pentanediol, 1,2-hexanediol, 1,5-hexanediol, 1,6-hexanediol, 2,5-hexanediol, 1,2-cyclohexanediol, 1,3-cyclohexanediol, 1,4-cyclohexanediol, 1,2-cyclohexanedimethanol, 1,4-cyclohexanedimethanol, 1,3,5-cyclohexanetrimethanol, 1,2-cyclopentanediol, 1,3-cyclopentanediol, 1,2-cyclooctanediol, 1,5-cyclooctanediol, tricyclodecanedimethanol, 2,3-norbornanediol, 2(3)-hydroxy-5,6-bis(hydroxymethyl)norbornane, 2,3-dihydroxy-5(6)-hydroxymethylnorbornane, 1,4-anhydroerythritol, L-arabinose, L-arabitol, D-cellobiose, cellulose, 1,5-decalindiol, glucose, galactose, lactose, maltose, mannose, mannitol or the like, and at least one of them can be used.

The content of the polymer containing a unit represented by the general formula (1) in the negative photoresist composition of the present invention is usually from 50 to 98 parts by weight, and preferably from 70 to 95 parts by weight, based on 100 parts by weight of the whole constituent components including the polymer. When the content is smaller than 50 parts by weight, it is sometimes difficult to form a uniform film. On the other hand, when the content is more than 98 parts by weight, the amount of the crosslinking agent and photo-acid generating agent, which can be incorporated, is reduced necessarily. Therefore, sufficient crosslinking does not occur to obtain no pattern, sometimes. The content of the crosslinking agent is usually from 1 to 50 parts by weight, and preferably from 10 to 30 parts by weight, based on 100 parts by weight of the whole constituent components including the crosslinking agent. When the content is smaller than 1 part by weight, sufficient crosslinking of the polymer does not occur to obtain no pattern, sometimes. On the other hand, when the content is not less than 50 parts by weight, it is difficult to form a uniform film and the transparency of the thin film is sometimes lowered. Furthermore, the content of the polymer is also insufficient and sufficient etching resistance is not obtained, sometimes.

The content of the photo-acid generating agent is usually from 0.2 to 15 parts by weight, and preferably from 0.5 to 10 parts by weight, based on 100 parts by weight of the whole constituent components including the photo-acid generating agent. When the content is smaller than 0.2 parts by weight, the sensitivity of the negative resist composition of the present invention is drastically lowered and it is difficult to form a pattern, sometimes. On the other hand, when the content exceeds 15 parts by weight, it becomes difficult to form a uniform coated film, thereby sometimes causing a problem such as scum. When the polyhydric alcohol is contained in the amount of 0.2 to 20 parts by weight based on 100 parts by weight of the whole constituent components including the polyhydric alcohol, it is effective to improve the definition.

The solvent used preferably in the present invention may be any organic solvent as far as the negative resist composition of the present invention dissolve sufficiently in the solvent and the resulting solution thereof can form a uniform coated film by a process such as spin coating process. The solvents may be used alone, or two or more solvents may also be used in combination. Specific examples thereof include n-propyl alcohol, isopropyl alcohol, n-butyl alcohol, tert-butyl alcohol, methylcellosolve acetate, ethylcellosolve acetate, propyrene glycol monoethyl ether acetate (1-methoxy-2-acetoxypropane), methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol monomethyl ether, diethylene glycol dimethyl ether and the like, but are not limited thereto.

If necessary, other components such as surfactants, pigments, stabilizers, coating property modifiers, dyes, etc. may be added to the resist composition of the present invention.

In the resist composition of the present invention, a known polymer having an alicyclic group capable of affording high dry etching resistance is used as a base resin. This polymer shows high transparency to light having a short wavelength of not more than 220 nm, such as ArF excimer laser beam, because it has not a benzene ring. As described above, the resist composition of the present invention is a chemical amplification type resist and also has both transparency to light having a short wavelength of not more than 220 nm, such as ArF excimer laser beam, and high dry etching resistance.

Figure 1B:
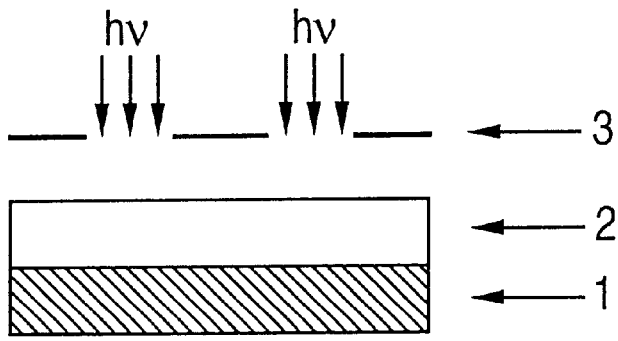
Figure 1C:
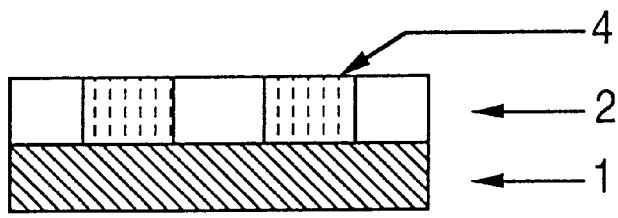
Figure 1D:
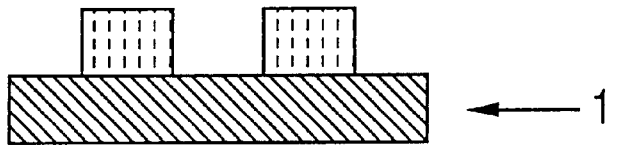

The present invention also provides a process for forming a negative pattern of a photoresist on a substrate to be worked by using the above photoresist material. The process for forming the negative pattern of the present invention is shown in FIG. 1. First, as shown in FIG. 1(A), a negative photoresist material of the present invention is coated on a substrate 1 to be worked and the coated substrate is subjected to a prebaking treatment at 60–170° C. for 30 to 240 seconds by using a heating means such as hot plate, thereby to form a resist film 2. As shown in FIG. 1(B), the resist film 2 is selectively exposed to light by using an exposure apparatus. After the completion of the exposure, the resist film 2 is subjected to a heat treatment. As a result, crosslinking of the resin occurs at the exposed area 4. Finally, as shown in FIG. 1(D), only the non-exposed portion of the resist film 2 is selectively dissolved and removed by using an alkali developer such as aqueous tetramethylammonium hydroxide (TMAH) solution, thereby to form a negative pattern.

The negative photoresist material of the present invention can be employed as a novel negative photoresist material in the production of a semiconductor device because of high transparency to light having a short wavelength of not more than 220 nm, such as ArF excimer laser beam, dry etching resistance and definition.

EXAMPLES
The following Examples further illustrate the present invention in detail but are not to be construed to limit the scope thereof. The polymer used in the following Examples is a random polymer having each of the following monomer unit compositions and can be obtained by each of processes described in Production Examples 1 to 9.
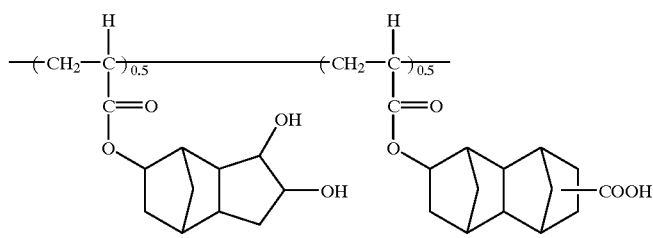
A1
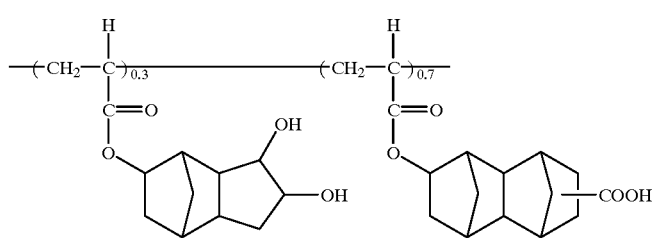
A2
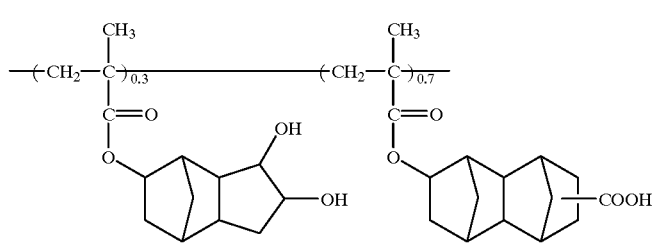
A3
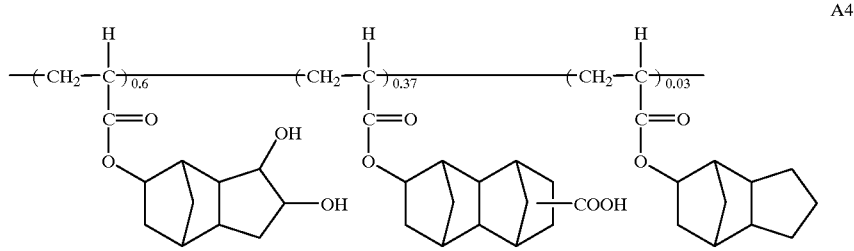
A4
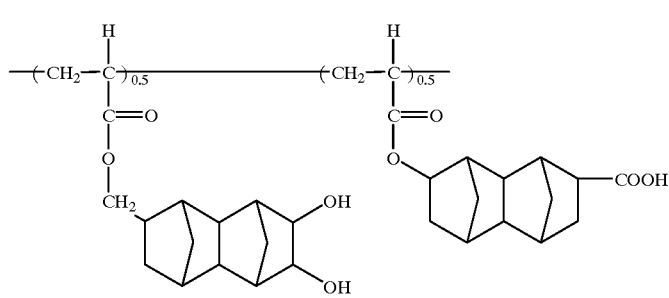
A5

A6
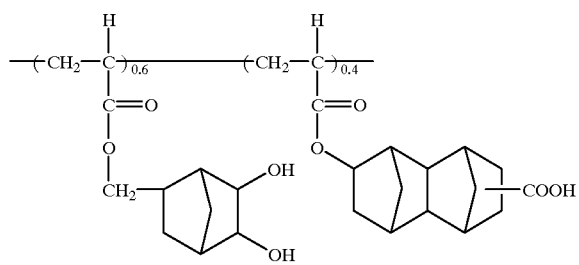
A7
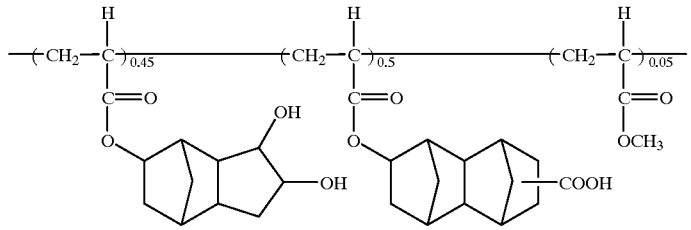
A8
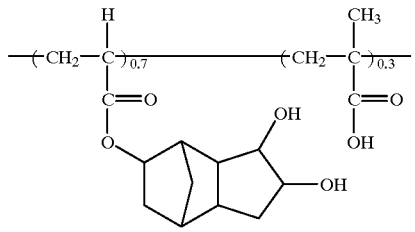
A9
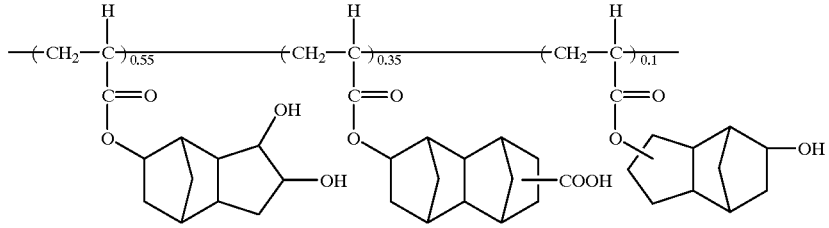
The crosslinking agent was used by selecting from the following compounds.
B1
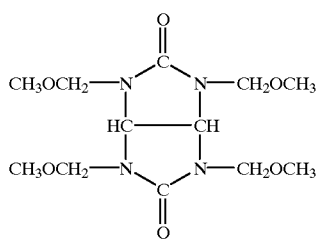
B2
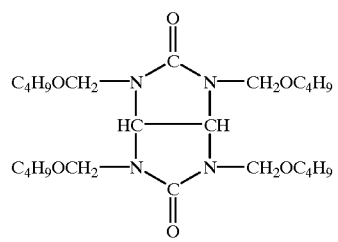
B3
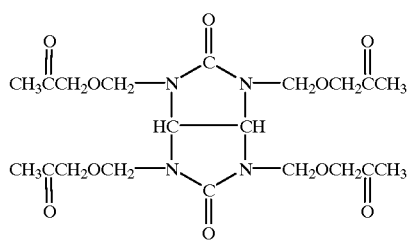

23
-continued

B4
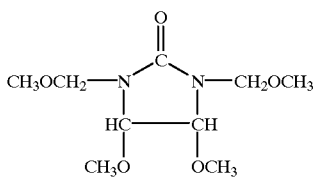

B5
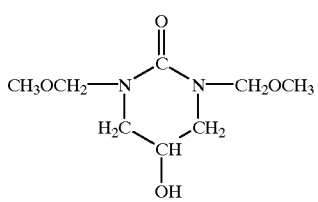

Furthermore, the photo-acid generating agent and polyhydric alcohol were used by selecting from the following compounds.

C1
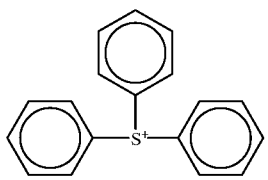
CF$_3$SO$_3^-$

C2
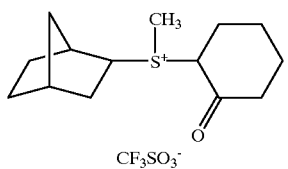
CF$_3$SO$_3^-$

C3
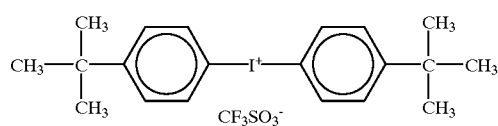
CF$_3$SO$_3^-$

C4
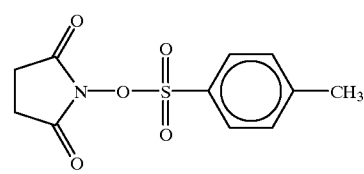

C5
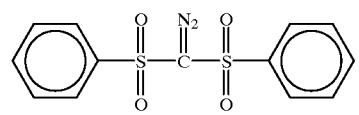

D1
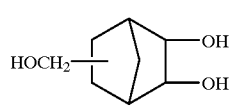

Production Example 1

Production of 3,4-dihydroxytricyclo[5.2.1.0$^{2,6}$]decyl acrylate

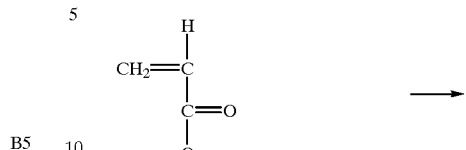

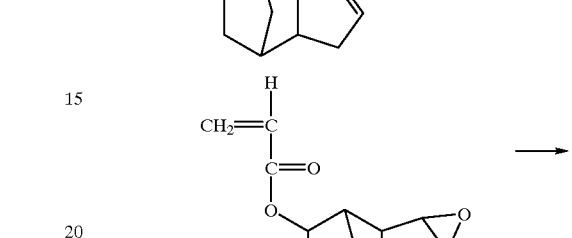

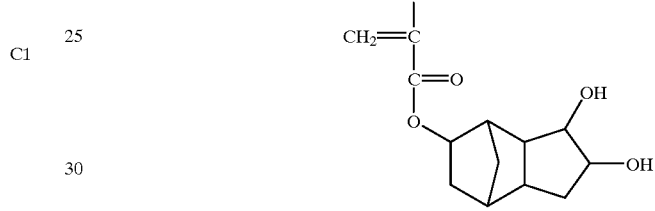

In a 500 ml three-necked flask, 25 g (0.122 mol) of dicyclopentenyl acrylate (FA-5111A, manufactured by Hitachi Chemical Industries Co., Ltd.) is dissolved in 320 ml of dried methylene chloride and the solution is ice-cooled. To the solution, 39.25 g of m-chloroperoxybenzoic acid is added and the mixture is stirred under ice cooling for 1 hour, then at room temperature for 2 hours. The deposited m-chlorobenzoic acid is separated by filtration and the filtrate is washed in turn with 300 ml of an aqueous 10% sodium hydrogensulfite solution, 200 ml of an aqueous 5% sodium carbonate solution and a saturated sodium chloride solution. The solution is dried over magnesium sulfate and methylene chloride is distilled off under reduced pressure to obtain 25 g of 3,4-epoxytricyclodecyl acrylate (yield: 93%). Then, 11 g (0.05 mol) of 3,4-epoxytricyclodecyl acrylate is dissolved in 80 ml of tetrahydrofuran and the solution is ice-cooled. To the solution, 40 ml of an aqueous 35% perchloric acid solution is added dropwise and the mixture is stirred at room temperature for 2 hours. To the reaction solution, 200 ml of ether is added and the solution is washed with an aqueous 5% sodium hydrogencarbonate solution until the aqueous layer is made alkaline. After washing with a saturated sodium chloride solution, the organic layer is dried over magnesium sulfate. The solvent is distilled off under reduced pressure and the residue is washed with 100 ml of a mixed solvent of hexane and ethyl acetate (5:1) to obtain 8 g of 3,4-dihydroxytricyclodecyl acrylate as the desired product (viscous liquid, yield: 67%). $^1$H-NMR (CDCl$_3$) δ 0.86–2.50 (10H, m), 3.25–3.70 (2H, br), 4.02–4.18 (2H, m), 4.61 (1H, s), 5.79 (1H, d), 6.08 (1H, dd), 6.36 (1H, d); IR (KBr) 3400 (ν OH), 2848, 2940 (ν CH), 1712 (ν C—O), 1614, 1628 (ν C—C) cm$^{-1}$ Process for Production of Polymer A1

In a 100 ml Kjeldahl flask equipped with a reflux condenser, 4 g of 3,4-dihydroxytricyclo[5.2.1.0$^{2,6}$]decyl acrylate and 4.72 g of carboxytetracyclo[4.4.0.1$^{2,5}$.1$^{7,10}$] dodecyl acrylate were dissolved in 50 ml of dried tetrahydrofuran. To the solution, 110 mg of azobisisobutyronitrile (AIBN) was added and the mixture was stirred at 60–65° C. under an argon atmosphere. After two hours, the reaction mixture was air-cooled and poured into 800 ml of ligroin/ ether (1:1), and then the resulting precipitate was separated by filtration. Furthermore, the purification was conducted again by reprecipitation to obtain 4.8 g of the desired product (yield: 55%). In this case, a copolymerization ratio obtained from an integration ratio of $^1$H-NMR was 50:50 (x=0.65, y=0.35). A weight-average molecular weight (Mw) and a distribution degree (Mw/Mn), determined by GPC analysis, were 8300 (in terms of polystyrene) and 1.98, respectively.

Production Example 2

Process for Production of Polymer A2

In the same manner as in Production Example 1, except for using 3 g of 3,4-dihydroxytricyclo[5.2.1.0$^{2,6}$]decyl acrylate, 8.24 g of carboxytetracyclo[4.4.0.1$^{2,5}$, 1$^{7,10}$] dodecyl acrylate and 138 mg of AIBN, the desired product was synthesized. Yield: 51%, Mw=9300, Mw/Mn=1.79

Production Example 3

Production of 3,4-dihydroxytricyclo[5.2.1.0$^{2,6}$]decyl methacrylate

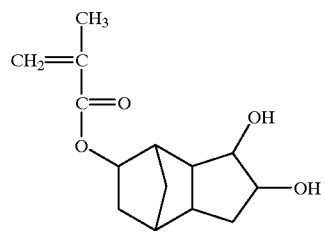

In the same manner as in Example 1, except for using dicyclopentenyl methacrylate (product No. 40967-7, manufactured by Aldrich Chemical Co., Inc.) in place of dicyclopentenyl acrylate, the desired product was synthesized (viscous liquid, total yield: 52%). $^1$H-NMR (CDCl$_3$) δ 0.78–2.54 (10H, m), 1.95 (3H, s), 3.2–3.75 (2H, br), 4–4.3 (2H, m), 4.62 (1H, s), 5.57 (1H, s), 6.07 (1H, s); IR (KBr) 3400 (ν OH), 2850, 2940 (ν CH), 1716 (ν C—O), 1630 (ν C—C) cm$^{-1}$ Process for Production of Polymer A3

In the same manner as in Production Example 1, except for using 3 g of 3,4-dihydroxytricyclo[5.2. 1.0$^{2,6}$]decyl methacrylate, 8.16 g of carboxytetracyclo[4.4.0.1$^{2,5}$.1$^{7,10}$] dodecyl methacrylate and 138 mg of AIBN, the desired product was synthesized. Yield: 65%, Mw=28600, Mw/Mn= 2.22

Production Example 4

Process for Production of Polymer A4

In a 100 ml Kjeldahl flask equipped with a reflux condenser, 4 g of 3,4-dihydroxytricyclo[5.2.1.0$^{2,6}$]decyl acrylate, 2.9 g of carboxytetracyclo[4.4.0.1$^{2,5}$.1$^{7,10}$]dodecyl acrylate and 1.74 g of tricyclodecyl[5.2.1.0$^{2,6}$]acrylate were dissolved in 36 ml of dried tetrahydrofuran. To the solution, 84 mg of azobisisobutyronitrile (AIBN) was added and the mixture was stirred at 60–65° C. under an argon atmosphere. After two hours, the reaction mixture was air-cooled and poured into 1000 ml of ligroin/ether (1:1), and then the resulting precipitate was separated by filtration. Furthermore, the purification was conducted again by reprecipitation to obtain 5.62 g of the desired product (yield: 65%). Mw=11500, Mw/Mn=2.03

Production Example 5

Production of 3,4-dihydroxytetracyclo[4.4.0.1$^{2,5}$.1$^{7,10}$]dodecylmethyl acrylate

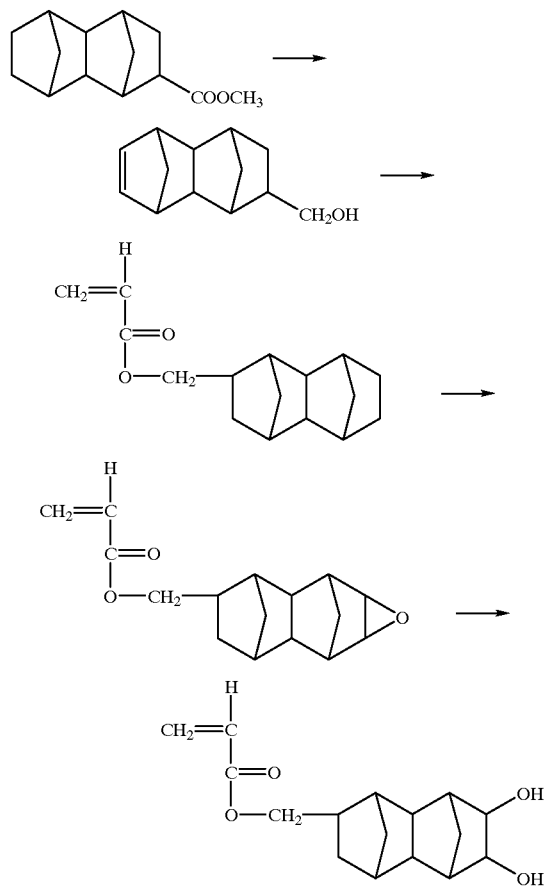

10.26 g of lithium aluminum hydride is suspended in 210 ml of dried ether. To the suspension, 59 g of 8-carboxymethyltetracyclo[4.4.0.1$^{2,5}$.1$^{7,10}$]-3-dodecene was added dropwise and the mixture is stirred at room temperature for 2 hours. To the reaction mixture, iced water is added and the unreacted lithium aluminum hydride is decomposed. Then, 400 ml of 10% sulfuric acid is added. After 200 ml of ether is added to separate an aqueous layer, the aqueous layer is washed in turn with 200 ml of an aqueous 3% sodium carbonate solution and a saturated sodium chloride solution. The organic layer is dried over magnesium sulfate, and then ether is distilled off under reduced pressure to obtain 40 g of 8-hydroxymethyltetracyclo[4.4.0.1$^{2,5}$.1$^{7,10}$]-3-dodecene (yield: 78%). Then, 40 g (0.21 mol) of 8-hydroxymethyltetracyclo[4.4.0.1$^{2,5}$.1$^{7,10}$]-3-dodecene, 30.6 g of N,N-dimethylaniline and 50 m g of phenothiazine are dissolved in 120 ml of dried tetrahydrofuran and the solution is ice-cooled. To the solution, a solution prepared by dissolving 20.93 g of acryloyl chloride in 30 ml of dried tetrahydrofuran is added dropwise. The mixture is stirred under ice cooling for 1 hour and then stirred at room temperature overnight. The deposited aniline hydrochloride is separated by filtration and the filtrate is concentrated under reduced pressure. To the residue, 200 ml of ether is added and the solution is washed in turn with 300 ml of 0.5N hydrochloric acid, a saturated sodium chloride solution, 200 ml of an aqueous 3% sodium hydrogencarbonate solution and a saturated sodium chloride solution. After the organic layer is dried over magnesium sulfate, ether is distilled off under reduced pressure to obtain 35 g of 8-acryloyloxymethyltetracyclo[4.4.0.1$^{2,5}$.1$^{7,10}$]-3-dodecene (yield: 68%). Then, 30 g (0.123 mol) of 8-acryloyloxymethyltetracyclo[4.4.0.1$^{2,5}$.1$^{7,10}$]-3-dodecene is dissolved in 340 ml of dried methylene chloride. To the solution, 39.3 g of m-chloroperoxybenzoic acid is added under ice cooling and the mixture is stirred under ice cooling for 2 hours. The deposited m-chlorobenzoic acid is separated by filtration and the filtrate is washed in turn with 300 ml of an aqueous 10% sodium hydrogensulfite solution, 300 ml of an aqueous 4% sodium hydrogencarbonate and a saturated sodium chloride solution. After the organic layer is dried over magnesium sulfate, methylene chloride is distilled off under reduced pressure to obtain 30.2 g of 3,4-epoxytetracyclo[4.4.0.1$^{2,5}$.1$^{7,10}$]dodecylmethyl acrylate (yield: 94%). Then, 20 g (0.077 mol) of 3,4 -epoxytetracyclo [4.4.0.1$^{2,5}$.1$^{7,10}$]dodecylmethyl acrylate is dissolved in 120 ml of tetrahydrofuran and 56 ml of an aqueous 35% perchloric acid is added dropwise to the solution under ice cooling.

After stirring at room temperature for 1.5 hours, 200 ml of ether is added and the mixture is washed in turn with a saturated sodium chloride solution, 300 ml of an aqueous 5% sodium hydrogencarbonate solution and a saturated sodium chloride solution. After the organic layer is dried over magnesium sulfate, the solvent is distilled off under reduced pressure. The residue is washed with 60 ml×4 of a mixed solvent of hexane/ethyl acetate (5:1) to obtain 11 g of 3,4-dihydroxytetracyclo[4.4.0.1$^{2,5}$.1$^{7,10}$]dodecylmethyl acrylate as the desired product (viscous liquid, yield: 51%). $^1$H-NMR (CDCl$_3$) δ 0.82–2.27 (13H, m), 3.24–3.70 (4H, m), 3.7–4.2 (2H, m), 5.83 (1H, d), 6.12 (1H, dd), 6.4 (1H, d); IR (KBr) 3440 (ν OH), 2856, 2928 (ν CH), 1710 (ν C—O), 1614, 1626 (ν C—C) cm$^{-1}$ Production Example 5

Process for Production of Polymer A5

In the same manner as in Production Example 1, except for using 5 g of 3,4-dihydroxytetracyclo[4.4.0.1$^{2,5}$.1$^{7,10}$] dodecylmethyl acrylate, 5 g of carboxytetracyclo[4.4.0.1$^{2,}$ $_5$.1$^{7,10}$]dodecyl acrylate and 117 mg of AIBN, the desired product was synthesized. Yield: 62%, Mw=6100, Mw/Mn= 1.83

Production Example 6

Process for Production of Polymer A6

In a 100 ml Kjeldahl flask equipped with a reflux condenser, 6 g of dihydroxynorbornylmethyl acrylate and 5.24 g of carboxytetracyclo[4.4.0.1$^{2,5}$.1$^{7,10}$]dodecyl acrylate were dissolved in 45 ml of dried tetrahydrofuran. To the solution, 154 mg of AIBN was added and the mixture was stirred at 60–65° C. under an argon atmosphere. After 2.5 hours, the reaction mixture was air-cooled and poured into 1000 ml of ligroin/ether (1:1), and then the resulting precipitate was separated by filtration. Furthermore, the purification was conducted again by reprecipitation to obtain 7.8 g of the desired product (yield: 70%). Mw=13800, Mw/Mn= 2.12

Production Example 7

Process for Production of Polymer A7

In a 100 ml Kjeldahl flask equipped with a reflux condenser, 10 g of 3,4-dihydroxytricyclo[5.2.1.0$^{2,6}$]decyl acrylate, 10.74 g of carboxytetracyclo[4.4.0.1$^{2,5}$.1$^{7,10}$] dodecyl acrylate and 0.334 g of acrylate were dissolved in 80 ml of dried tetrahydrofuran. To the solution, 255 mg of AIBN was added and the mixture was stirred at 60–65° C. under an argon atmosphere. After 2 hours, the reaction mixture was air-cooled and poured into 1000 ml of ligroin/ ether (1:1), and then the resulting precipitate was separated by filtration. Furthermore, the purification was conducted again by reprecipitation to obtain 14.33 g of the desired product (yield: 68%). Mw=9500, Mw/Mn=2.37

Production Example 8

Process for Production of Polymer A8

In a 100 ml Kjeldahl flask equipped with a reflux condenser, 10 g of 3,4-dihydroxytricyclo[5.2.1.0$^{2,6}$]decyl acrylate and 1.54 g of methacrylic acid were dissolved in 45 ml of dried tetrahydrofuran. To the solution, 195 mg of AIBN was added and the mixture was stirred at 60–65° C. under an argon atmosphere. After 2 hours, the reaction mixture was air-cooled and poured into 1000 ml of ligroin/ ether (1:1), and then the resulting precipitate was separated by filtration. Furthermore, the purification was conducted again by reprecipitation to obtain 8.52 g of the desired product (yield: 74%). Mw=13200, Mw/Mn=2.85

Production Example 9

Process for Production of Polymer A9

In a 100 ml Kjeldahl flask equipped with a reflux condenser, 6.75 g of 3,4-dihydroxytricyclo[5.2.1.0$^{2,6}$]decyl acrylate, 5 g of carboxytetracyclo[4.4.0.1$^{2,5}$.1$^{7,10}$]dodecyl acrylate and 1.15 g of hydroxytricyclo[5.2.1.0$^{2,6}$]decyl acrylate were dissolved in 50 ml of dried tetrahydrofuran. To the solution, 170 mg of AIBN was added and the mixture was stirred at 60–65° C. under an argon atmosphere. After 2 hours, the reaction mixture was air-cooled and poured into 1000 ml of ligroin/ether (1:1), and then the resulting precipitate was separated by filtration. Furthermore, the purification was conducted again by reprecipitation to obtain 5.82 g of the desired product (yield: 45%). Mw=5400, Mw/Mn=2.65

Example 1

A negative photoresist composition (hereinafter merely referred to as a resist) of the following composition was prepared. The following operation was conducted under a yellow lamp.

(a) polymer A1: 4.6 g (b) crosslinking agent B1: 0.35 g (c) photo-acid generating agent C1 (triphenylsulfonium trifluoromethanesulfonate): 0.05 g (d) ethyl lactate: 31 g The weight-average molecular weight (also the same as in case described below) of the polymer A1 used was 8300. The molecular weight was measured by gel permeation chromatography (GPC) using LC-9A (KF-80M, manufactured by Showa Denko Co.) and determined as a molecular weight in terms of polystyrene.

A mixture of the above respective components was filtered by using a 0.2 μm Tetoron filter to prepare a resist. The resist was spin-coated on a 3 inch quartz substrate and then heated on a hot plate at 100° C. for 60 seconds to form a thin film having a film thickness of 0.5 μm. Transmittance of this thin film at 193.4 nm (center wavelength of ArF excimer laser beam) was 63.5%. This corresponds to sufficient transparency as a single-layer resist.

Example 2

The resist prepared in Example 1 was spin-coated on a 4 inch silicon substrate and then heated on a hot plate at 100° C. for 60 seconds to form a thin film having a film thickness of 0.5 μm. This film was allowed to stand in an apparatus for adhesion type exposure test, wherein the atmosphere is sufficiently purged with nitrogen. A mask made of a quartz plate with a pattern formed by using chromium was made closely contact with the resist film, which was exposed to ArF excimer laser beam through the mask. Immediately after the exposure, the exposed resist film was baked on a hot plate at 120° C. for 60 seconds, developed by using an aqueous 2.38% TMAH solution at a liquid temperature of 23° C. for 60 seconds in accordance with a dipping process, and then subjected to a rinsing treatment by using pure water for 60 seconds. As a result, only the non-exposed portion of the resist film was dissolved in the developer and removed, thereby to obtain a negative pattern of 0.25 μmL/S at a dose of 7.2 mJ/cm$^2$.

Example 3

A resist of the following composition was prepared. The following test was conducted under a yellow lamp.

(a) polymer A1: 4.25 g
(b) crosslinking agent B1: 0.35 g
(c) photo-acid generating agent C1 (triphenylsulfonium trifluoromethanesulfonate): 0.05 g
(d) polyhydric alcohol D1: 31 g
(e) diethylene glycol dimethyl ether: 31 g The resist thus prepared was spin-coated on a 4 inch silicon substrate and then heated on a hot plate at 100° C. for 60 seconds to form a thin film having a film thickness of 0.5 μm. This film was allowed to stand in an apparatus for adhesion type exposure test, wherein the atmosphere is sufficiently purged with nitrogen. A mask made of a quartz plate with a pattern formed by using chromium was made closely contact with the resist film, which was exposed to ArF excimer laser beam through the mask. Immediately after the exposure, the exposed resist film was baked on a hot plate at 120° C. for 60 seconds, developed by using an aqueous 2.38% TMAH solution at a liquid temperature of 23° C. for 60 seconds in accordance with a dipping process, and then subjected to a rinsing treatment by using pure water for 60 seconds. As a result, only the non-exposed portion of the resist film was dissolved in the developer and removed, thereby to obtain a negative pattern of 0.20 μmL/S at a dose of 3.5 mJ/cm$^2$.

Example 4

In the same manner as in Example 3, except for using 0.35 g of a crosslinking agent B2 in place of the crosslinking agent B1, a resist was prepared and an exposure test was conducted. As a result, a negative pattern of 0.225 μmL/S was obtained at a dose of 39.3 mJ/cm$^2$.

Example 5

In the same manner as in Example 3, except for using a crosslinking agent B3 in place of the crosslinking agent B1, a resist was prepared and an exposure test was conducted. As a result, a negative pattern of 0.3 μmL/S was obtained at a dose of 10.2 mJ/cm$^2$.

Example 6

In the same manner as in Example 3, except for using a crosslinking agent B4 in place of the crosslinking agent B1, a resist was prepared and an exposure test was conducted. As a result, a negative pattern of 0.25 μmL/S was obtained at a dose of 27 mJ/cm$^2$.

Example 7

In the same manner as in Example 3, except for using a crosslinking agent B5 in place of the crosslinking agent B1, a resist was prepared and an exposure test was conducted. As a result, a negative pattern of 0.4 μmL/S was obtained at a dose of 17.5 mJ/cm$^2$.

Example 8

In the same manner as in Example 3, except for using a polymer A2 in place of the polymer A1, a resist was prepared and the transmittance was measured. The molecular weight of the polymer A2 was 9300 (molecular weight in terms of polystyrene: 0). As a result of an exposure test, a negative pattern of 0.25 μmL/S was obtained at a dose of 15.2 mJ/cm$^2$.

Example 9

In the same manner as in Example 3, except for using a polymer A3 in place of the polymer A1 and using an aqueous 0.119 wt % TMAH solution in place of the aqueous 2.38 wt % TMAH solution, a resist was prepared and an exposure test was conducted. Then, transmittance was measured. The molecular weight of the polymer A3 was 28600 (molecular weight in terms of polystyrene). As a result of the exposure test, a negative pattern of 0.25 μmL/S was obtained at a dose of 7.3 mJ/cm$^2$.

Example 10

In the same manner as in Example 3, except for using a polymer A4 in place of the polymer A1, a resist was prepared and an exposure test was conducted. The molecular weight of the polymer A4 was 11500 (molecular weight in terms of polystyrene). As a result of the exposure test, a negative pattern of 0.25 μmL/S was obtained at a dose of 4.5 mJ/cm$^2$.

Example 11

In the same manner as in Example 3, except for using a polymer A5 in place of the polymer A1, a resist was prepared and an exposure test was conducted. The molecular weight of the polymer A5 was 6100 (molecular weight in terms of polystyrene). As a result of the exposure test, a negative pattern of 0.25 μmL/S was obtained at a dose of 8 mJ/cm$^2$.

Example 12

In the same manner as in Example 3, except for using a polymer A6 in place of the polymer A1, a resist was prepared and an exposure test was conducted. The molecular weight of the polymer A6 was 13800 (molecular weight in terms of polystyrene). As a result of the exposure test, a negative pattern of 0.225 μmL/S was obtained at a dose of 3.8 mJ/cm$^2$.

Example 13

In the same manner as in Example 3, except for using a polymer A7 in place of the polymer A1, a resist was prepared and an exposure test was conducted. The molecular weight of the polymer A7 was 7200 (molecular weight in terms of polystyrene). As a result of the exposure test, a negative pattern of 0.25 μmL/S was obtained at a dose of 6.2 mJ/cm².

Example 14

In the same manner as in Example 3, except for using a polymer A8 in place of the polymer A1, a resist was prepared and an exposure test was conducted. The molecular weight of the polymer A8 was 13800 (molecular weight in terms of polystyrene). As a result of the exposure test, a negative pattern of 0.225 μmL/S was obtained at a dose of 3.8 mJ/cm².

Example 15

In the same manner as in Example 3, except for using a polymer A9 in place of the polymer A1, a resist was prepared and an exposure test was conducted. The molecular weight of the polymer A9 was 8150 (molecular weight in terms of polystyrene). As a result of the exposure test, a negative pattern of 0.20 μmL/S was obtained at a dose of 4.5 mJ/cm².

Example 16

A resist of the following composition was prepared. The following test was conducted under a yellow lamp.
(a) polymer A1: 4.05 g
(b) crosslinking agent B1: 0.35 g
(c) photo-acid generating agent C2 (β-oxocyclohexylmethyl(norbornyl)trifluoromethane sulfonate): 0.25 g
(d) polyhydric alcohol D1: 0.35 g
(e) diethylene glycol dimethyl ether: 23 g The resist thus prepared was spin-coated on a 4 inch silicon substrate and then heated on a hot plate at 100° C. for 60 seconds to form a thin film having a film thickness of 0.5 μm. This film was allowed to stand in an apparatus for adhesion type exposure test, wherein the atmosphere is sufficiently purged with nitrogen. A mask made of a quartz plate with a pattern formed by using chromium was made closely contact with the resist film, which was exposed to ArF excimer laser beam through the mask. Immediately after the exposure, the exposed resist film was baked on a hot plate at 120° C. for 60 seconds, developed by using an aqueous 2.38% TMAH solution at a liquid temperature of 23° C. for 60 seconds in accordance with a dipping process, and then subjected to a rinsing treatment by using pure water for 60 seconds. As a result, only the non-exposed portion of the resist film was dissolved in the developer and removed, thereby to obtain a negative pattern of 0.225 μmL/S at a dose of 17.7 mJ/cm².

Example 17

In the same manner as in Example 3, except for using a photo-acid generating agent C3 (bis(tert-butylphenyl) iodonium trifluoromethanesulfonate in place of the photo-acid generating agent C1, a resist was prepared and an exposure test was conducted. As a result, a negative pattern of 0.40 μmL/S was obtained at a dose of 15 mJ/cm².

Example 18

A resist of the following composition was prepared. The following test was conducted under a yellow lamp.
(a) polymer A1: 4.15 g
(b) crosslinking agent B1: 0.35 g
(c) photo-acid generating agent C4 (N-hydroxysucciimide-p-toluenesulfonate): 0.15 g
(d) polyhydric alcohol D1 (D1 shown in Example 3): 0.35 g
(e) diethylene glycol dimethyl ether: 23 g The resist thus prepared was spin-coated on a 4 inch silicon substrate and then heated on a hot plate at 100° C. for 60 seconds to form a thin film having a film thickness of 0.5 μm. This film was allowed to stand in an apparatus for adhesion type exposure test, wherein the atmosphere is sufficiently purged with nitrogen. A mask made of a quartz plate with a pattern formed by using chromium was made closely contact with the resist film, which was exposed to ArF excimer laser beam through the mask. Immediately after the exposure, the exposed resist film was baked on a hot plate at 140° C. for 60 seconds, developed by using an aqueous 2.38% TMAH solution at a liquid temperature of 23° C. for 60 seconds in accordance with a dipping process, and then subjected to a rinsing treatment by using pure water for 60 seconds. As a result, only the non-exposed portion of the resist film was dissolved in the developer and removed, thereby to obtain a negative pattern of 0.25 μmL/S at a dose of 22 mJ/cm².

Example 19

In the same manner as in Example 15, except for using a photo-acid generating agent C5 (bis(benzenesulfonyl) diazomethane) in place of the photo-acid generating agent C4, a resist was prepared and an exposure test was conducted. As a result, a negative pattern of 0.40 μmL/S was obtained at a dose of 8.5 mJ/cm².

Example 20

A resist of the following composition was prepared. The following test was conducted under a yellow lamp.
(a) polymer A1: 4.65 g
(b) crosslinking agent B1 (B1 shown in Example 1): 0.35 g
(c) ethyl lactate: 31 g A mixture of the above respective components was filtered by using a 0.2 μm Tetoron filter to prepare a resist. The resist thus prepared was spin-coated on a 3 inch silicon substrate and then baked on a hot plate at 100° C. for 60 seconds to form a thin film having a film thickness of 0.7 μm. An etching rate of the resulting film to a $CF_4$ gas was measured by using a reactive ion etching (RIE) apparatus DEM451, manufactured by Nichiden Aneruba Co. (etching conditions: power=100 W, pressure=5 Pa, gas flow rate=30 sccm). The results are shown in Table 3. For comparison, the results of films coated with novolak resist (PFI-15A, manufactured by Sumitomo Chemical Co., Ltd.), poly(p-vinylphenol) used as a base polymer of KrF resist, and poly(methyl methacrylate) as a polymer having no bridged cyclic hydrocarbon group in the molecular structure are also shown. The etching rate was standardized with respect to the novolak resist. It was shown from the results thus obtained that the resist of the present invention exhibits low etching rate to the $CF_4$ gas and is superior in dry etching resistance. This fact shows that the resist of the present invention has high dry etching resistance.

Example 21

The same manner as in Example 20 was repeated, except that the etching rate of the resist using a polymer A2 in place of the polymer A1 was also measured. The results are shown in Table 2. It was shown from the results thus obtained that the resist of the present invention exhibits low etching rate to the CF$_4$ gas and is superior in dry etching resistance. This fact shows that the resist of the present invention has high dry etching resistance.

Example 22

The same manner as in Example 20 was repeated, except that the etching rate of the resist using a polymer A3 in place of the polymer A1 was also measured. The results are shown in Table 2. It was shown from the results thus obtained that the resist of the present invention exhibits low etching rate to the CF$_4$ gas and is superior in dry etching resistance. This fact shows that the resist of the present invention has high dry etching resistance.

TABLE 3

|  | Etching rate (relative ratio) |
| --- | --- |
| Example 19 | 1.18 |
| Example 20 | 1.17 |
| Example 21 | 1.28 |
| Poly(methyl methacrylate) | 1.9 |
| Poly(p-vinylphenol) | 1.2 |
| Novolak resist (PFI-15A) | 1 |

As is apparent from the above description, the negative photoresist material of the present invention can be used for lithography because of excellent transparency, and can also be used for formation of a fine pattern required in the production of a semiconductor device because of dry etching resistance and definition.

Production of other (meth)acrylate derivatives represented by the general formula (1):

Production Example 10

Production of 3,4-dihydroxytetracyclo[4.4.4.1$^{2,5}$.1$^{7,10}$]dodecylmethyl methacrylate

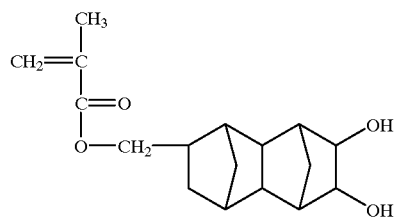

In the same manner as in Production Example 5, except for using methacryloyl chloride in place of acryloyl chloride, the desired product was synthesized (total yield: 25%). $^1$H-NMR (CDCl$_3$) δ 0.84–2.24 (13H, m), 1.95 (3H, s), 3.2–3.69 (4H, m), 3.68–4.22 (2H, m), 5.51 (1H, s), 6.05 (1H, s); IR (KBr) 3442 (ν OH), 2858, 2927 (ν CH), 1712 (ν C—O), 1628 (ν C—C) cm$^{-1}$ Production Example 11

Production of 3,4-dihydroxy-8-methyltetracyclo[4.4.0.1$^{2,5}$.1$^{7,10}$]dodecylmethyl methacrylate

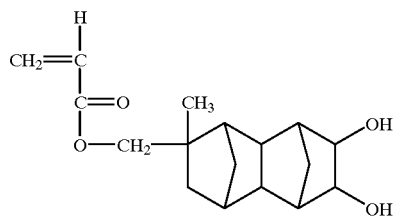

In the same manner as in Production Example 5, except for using 8-methyl-8-carboxymethyltetracyclo[4.4.0.1$^{2,5}$.1$^{7,10}$]-3-dodecene in place of 8-carboxymethyltetracyclo[4.4.0.1$^{2,5}$.1$^{7,10}$]-3-dodecene, the desired product was synthesized (total yield: 23%). $^1$H-NMR (CDCl$_3$) δ 0.75–2.3 (15H, m), 3.23–3.68 (4H, m), 3.7–4.2 (2H, m), 5.82 (1H, d), 6.11 (1H, dd), 6.4 (1H, d); IR (KBr) 3340 (ν OH), 2856, 2928 (ν CH), 1712 (ν C—O), 1615, 1628 (ν C—C) cm$^{-1}$ Production Example 12

Polymer of the following structure (in the general formula (6), R$^1$, R$^2$, R$^3$ and R$^5$ are a hydrogen atom; R$^5$ is a t-butoxycarbonyltetracyclo[4.4.0.1$^{2,5}$.1$^{7,10}$]dodecyl group; and x=0.65, y=0.35, z=0)

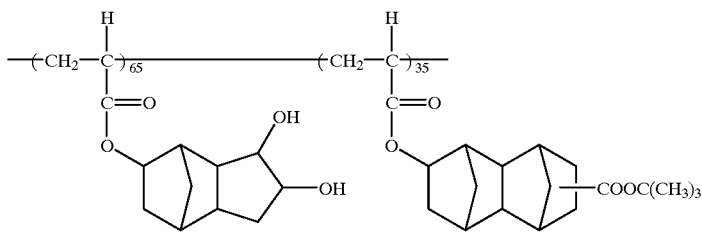

In a 100 ml Kjeldahl flask equipped with a reflux condenser, 4 g of the vinyl monomer obtained in Production Example 1 and 3 g of t-butoxycarbonyltetraclododecyl acrylate were dissolved in 38 ml of dried tetrahydrofuran. To the solution, 189 mg (30 mmol 1-1) of AIBN was added and the mixture was stirred at 60–65° C. under an argon atmosphere. After two hours, the reaction mixture was air-cooled and poured into 400 ml of ligroin/ether (1:1), and then the resulting precipitate was separated by filtration. Furthermore, the purification was conducted again by reprecipitation to obtain 3.36 g of the desired product (yield: 48%). In this case, a copolymerization ratio obtained from an integration ratio of $^1$H-NMR was 65:35 (x=0.65, y=0.35). A weight-average molecular weight (Mw) and a distribution degree (Mw/Mn), determined by QPC analysis, were 15700 (in terms of polystyrene) and 1.86, respectively.

Production Examples 13 to 14

In the same manner as in Production Example 12, except for changing the charging ratio of the monomers, the polymerization was conducted. The charging ratio, polymerization ratio of the polymer and weight-average molecular weight are shown in Table 4 below.

TABLE 4

|  | Charging ratio | x/y | Weight-average molecular weight |
| --- | --- | --- | --- |
| Production Example 13 | 0.1/0.9 | 0.1/0.9 | 17200 |
| Production Example 14 | 0.8/0.2 | 0.81/0.19 | 16000 |

Production Examples 15 to 16

In the same manner as in Production Example 12, except for changing the amount (concentration) of AIBN, the polymerization was conducted. The polymerization ratio (x/y) of the polymer and weight-average molecular weight are shown in Table 5 below.

TABLE 5

|  | Concentration of AIBN | x/y | Weight-average molecular weight |
| --- | --- | --- | --- |
| Production Example 15 | 4 mmol.1$^{-1}$ | 0.60/0.34 | 124000 |
| Production Example 16 | 80 mmol.1$^{-1}$ | 0.65/0.35 | 4200 |

Production Example 17

Polymer of the following structure (in the general formula (6), $R^1$, $R^2$, $R^3$ and $R^5$ are a hydrogen atom; $R^6$ is a carboxytetracyclo[4.4.0.1$^{2,5}$.1$^{7,10}$]dodecyl group; and x=0.65, y=0.35, z=0)

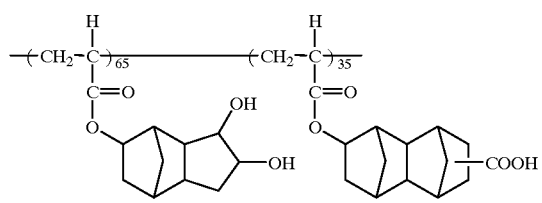

In the same manner as in Production Example 12, except for using carboxytetracyclododecyl acrylate in place of t-butoxycarbonyltetracyclododecyl acrylate, the desired product was synthesized. Yield: 56%, Mw=14800, Mw/Mn=1.89

Production Example 18

Polymer of the following structure (in the general formula (6), $R^1$, $R^2$ and $R^3$ are a hydrogen atom; $R^5$ is a methyl group; $R^6$ is a t-butyl group; and x=0.65, y=0.35, z=0)

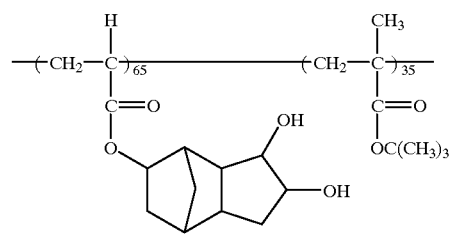

In the same manner as in Production Example 12, except for using t-butyl methacrylate in place of t-butoxycarbonyltetracyclododecyl acrylate, the desired product was synthesized. Yield: 52%, Mw=19500, Mw/Mn=2.02

Production Example 19

Polymer of the following structure (in the general formula (6), $R^1$, $R^2$, $R^3$ and $R^5$ are a hydrogen atom; $R^6$ is a t-butoxycarbonylnorbornyl group; and x=0.65, y=0.35, z=0)

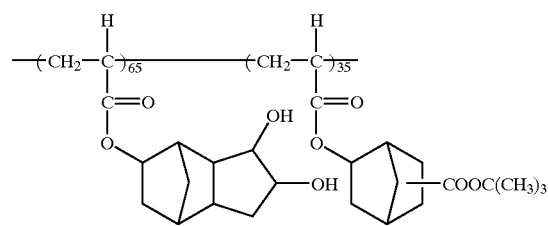

In the same manner as in Production Example 12, except for using a t-butoxycarbonylnorbornyl acrylate in place of the t-butoxycarbonyltetracyclo[4.4.0.1$^{2,5}$.1$^{7,10}$]dodecyl acrylate, the desired product was synthesized. Yield: 44%, Mw=17100, Mw/Mn=1.82

Production Example 20

Polymer of the following structure (in the general formula (6), $R^1$, $R^2$, $R^3$ and $R^5$ are a hydrogen atom; $R^6$ is a 3-methyl-t-butoxycarbonyltetracyclo[4.4.0.1$^{2,5}$.1$^{7,10}$]dodecyl group; $R^7$ is a methyl group; $R^8$ is a hydrogen atom; and x=0.55, y=0.35, z=0)

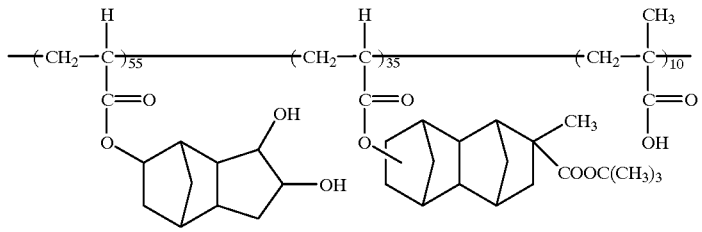

In a 100 ml Kjeldahl flask equipped with a reflux condenser, 4 g of the vinyl monomer obtained in Example 1, 3.55 g of 3-methyl t-butoxycarbonyltetracyclo[4.4.0.1$^{2,5}$.1$^{7,10}$]dodecyl acrylate and 0.26 g of methacrylic acid were dissolved in 42 ml of dried tetrahydrofuran. To the solution, 209 mg of AIBN was added and the mixture was stirred at 60–65° C. under an argon atmosphere. After 2 hours, the reaction mixture was air-cooled and poured into 500 ml of ligroin/ether (1:1), and then the resulting precipitate was separated by filtration. Furthermore, the purification was conducted again by reprecipitation to obtain 3.44 g of the desired product (yield: 44%). Mw=13800, Mw/Mn=1.94

Production Example 21

Polymer of the following structure (in the general formula (7), R$^1$, R$^4$ and R$^9$ are a hydrogen atom; R$^{10}$ is a t-butoxycarbonyltetracyclo[4.4.0.1$^{2,5}$.1$^{7,10}$]dodecyl group; and x=0.65, y=0.35, z=0)

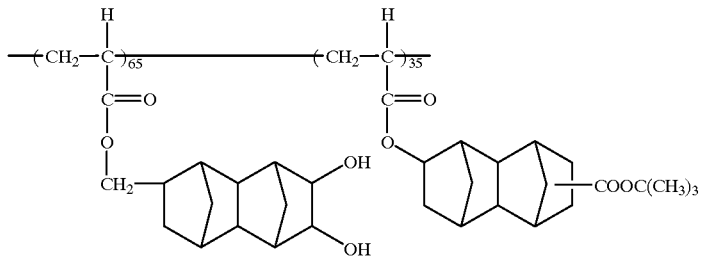

In the same manner as in Production Example 12, except for using the vinyl monomer obtained in Production Example 5 in place of the vinyl monomer obtained in Production Example 1, the desired product was synthesized. Yield: 45%, Mw=14200, Mw/Mn=1.88

Production Example 22

In the same manner as in Production Example 20, except for using the vinyl monomer obtained in Production Example 5 in place of the vinyl monomer obtained in Production Example 1 and using tricyclodecyl acrylate (FA-513A, manufactured by Hitachi Chemical Industries Co., Ltd.) in place of methacrylic acid, the desired product was synthesized. Yield: 52%, Mw=13500, Mw/Mn=1.78

Evaluation of Etching Resistance of Polymer 2 g of the resin obtained in Production Example 12 was dissolved in 10 g of ethyl acetate and the mixture was filtered by using a 0.2 μm Tetoron filter to prepare a resist. The resist thus prepared was spin-coated on a 3 inch silicon substrate and then baked on a hot plate at 90° C. for 60 seconds to form a thin film having a film thickness of 0.7 μm. An etching rate of the resulting film to a CF$_4$ gas was measured by using a reactive ion etching (RIE) apparatus DEM451, manufactured by Nichiden Aneruba Co. (etching conditions: power=100 W, pressure=5 Pa, gas flow rate=30 sccm). The results are shown in Table 6. In the same manner, the etching rate of a resin obtained in Production Example 22 was also measured. For comparison, the results of films coated with novolak resist (PFI-15A, manufactured by Sumitomo Chemical Co., Ltd.), poly(p-vinylphenol) used as a base polymer of KrF resist, and poly(methyl methacrylate) as a polymer having no bridged cyclic hydrocarbon group in the molecular structure are also shown. The etching rate was

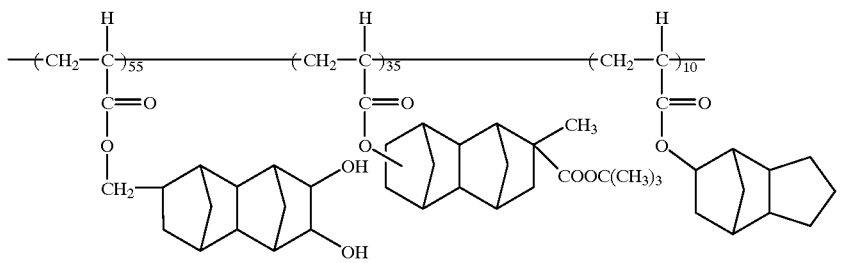

standardized with respect to the novolak resist.

TABLE 6

| | Etching rate (relative ratio) |
|---|---|
| Production Example 12 | 1.2 |
| Production Example 22 | 1.1 |
| Poly(methyl methacrylate) | 1.9 |
| Poly(p-vinylphenol) | 1.2 |
| Novolak resist (PFI-15A) | 1 |

As is apparent from the above results, the resin used in the present invention exhibits low etching rate to a $CF_4$ gas and is superior in dry etching resistance.

Evaluation of Transparency of Polymer 2.5 g of the resin obtained in Production Example 12 was dissolved in 10 g of ethyl acetate and the mixture was filtered by using a 0.2 μm Teflon filter. The resist thus prepared was spin-coated on a 3 inch silicon substrate and then baked on a hot plate at 90° C. for 60 seconds to form a thin film having a film thickness of 1 μm. With respect to this thin film, transmittance at 193.4 nm as a center wavelength of ArF excimer laser beam was measured by using an ultraviolet-visible spectrophotometer. In the same manner, the transmittance of a resin obtained in Production Example 22 was also measured.

As a result, the transmittance of the polymer obtained in Production Example 12 was 54%/μm and that of the polymer of Production Example 22 was 57%/μm. It could be confirmed from these results that the polymer of the present invention exhibits transparency enough to be employed as a single-layer resist.

Evaluation of Patterning of Resist Using Polymer

A resist of the following composition was prepared.

(a) polymer (Production Example 12): 2 g (b) photo-acid generating agent (triphenylsulfonium triflate): 0.02 g (d) polyethylene glycol monomethyl ether acetate: 11.5 g The above mixture was filtered by using a 0.2 μm Teflon filter to prepare a resist. The resist thus prepared was spin-coated on a 4 inch silicon substrate and then heated on a hot plate at 120° C. for 1 minute to form a thin film having a film thickness of 0.45 μm. This film was allowed to stand in an apparatus for adhesion type exposure test, wherein the atmosphere is sufficiently purged with nitrogen. A mask made of a quartz plate with a pattern formed by using chromium was made closely contact with the resist film, which was exposed to ArF excimer laser beam through the mask. Immediately after the exposure, the exposed resist film was baked on a hot plate at 95° C. for 60 seconds, developed by using an aqueous 2.38% TMAH solution at a liquid temperature of 23° C. for 60 seconds in accordance with a dipping process, and then subjected to a rinsing treatment by using pure water for 60 seconds. As a result, only the non-exposed portion of the resist film was dissolved in the developer and removed, thereby to obtain a positive pattern. In the same manner, a resist using the polymer obtained in Production Example 22 was also evaluated. The results of the sensitivity and resolution are shown in Table 7.

TABLE 7

| | Resolution (μmL/S) | Sensitivity (mJ/cm²) |
|---|---|---|
| Resist containing resin of Production Example 12 | 0.18 | 9 |
| Resist containing resin of Production Example 22 | 0.20 | 12 |

As is apparent from the above results, the photoresist material using the polymer of the present invention has excellent resolution characteristics. It was also confirmed that the photoresist material is also superior in substrate adhesion because a phenomenon such as pattern peeling did not occur.

What is claimed is:

1. A negative photoresist composition comprising a polymer having a unit represented by the general formula (1), a crosslinking agent of a compound having a functional group represented by the general formula (5), and a photo-acid generating agent capable of generating an acid by exposure.

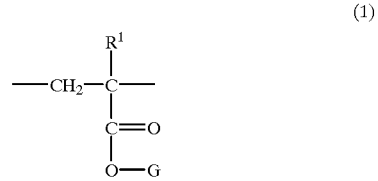

(in the general formula (1), $R^1$ represents a hydrogen atom or a methyl group, and G represents an alicyclic group having a 1,2-diol structure)

(in the general formula (5), $R^{10}$ represents a hydrogen atom, an alkyl group having 1 to 6 carbon atoms, or an oxoalkyl group having 3 to 6 carbon atoms).

2. The negative photoresist composition according to claim 1, further comprising a polyhydric alcohol.

3. The negative photoresist composition according to claim 1, wherein G is at least one of groups represented by the general formulas (2) to (4):

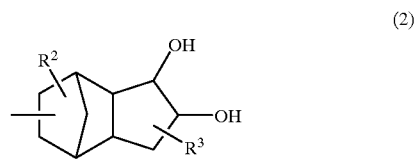

(in the general formula (2), $R^2$ and $R^3$ each independently represents a hydrogen atom or a methyl group);

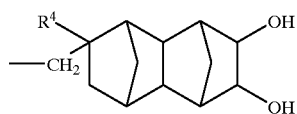
(3)

in the general formula (3), $R^4$ represents a hydrogen atom or a methyl group); and

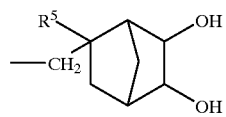
(4)

(in the general formula (4), $R^5$ represents a hydrogen atom or a methyl group).

4. The negative photoresist composition according to claim 1, wherein the polymer is at least one of polymers represented by the general formulas (6) to (8):

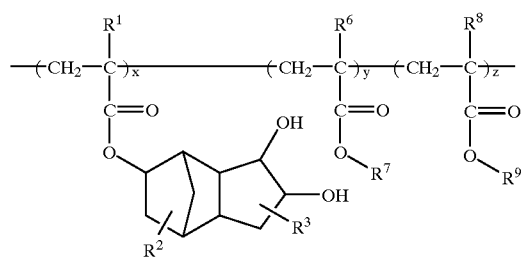
(6)

(in the general formula (6), $R^1$, $R^2$, $R^3$, $R^6$ and $R^8$ each independently represents a hydrogen atom or a methyl group; $R^7$ represents a bridged cyclic hydrocarbon group having 7 to 13 carbon atoms, which has a carboxyl group; $R^9$ represents a hydrogen atom, a hydrocarbon group having 1 to 12 carbon atoms, or a hydrocarbon group having 2 to 12 carbon atoms, which has a hydroxyl group; x, y and z each represents a composition ratio of each unit and is a number satisfying the expressions x+y+z=1, 0<x≦1, 0≦y<1 and 0≦z<1; and a weight-average molecular weight of the polymer is from 2000 to 200000);

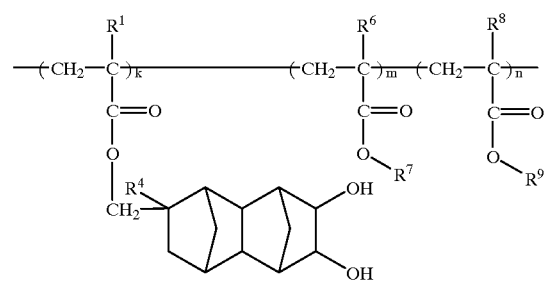
(7)

(in the general formula (7), $R^1$, $R^4$, $R^6$ and $R^8$ each independently represents a hydrogen atom or a methyl group; $R^7$ represents a bridged cyclic hydrocarbon group having 7 to 13 carbon atoms, which has a carboxyl group; $R^9$ represents a hydrogen atom, a hydrocarbon group having 1 to 12 carbon atoms, or a hydrocarbon group having 2 to 12 carbon atoms, which has a hydroxyl group; k, m and n each represents a composition ratio of each unit and is a number satisfying the expressions k+m+n=1, 0<k≦1, 0≦m<1 and 0≦n<1; and a weight-average molecular weight of the polymer is from 2000 to 200000); and

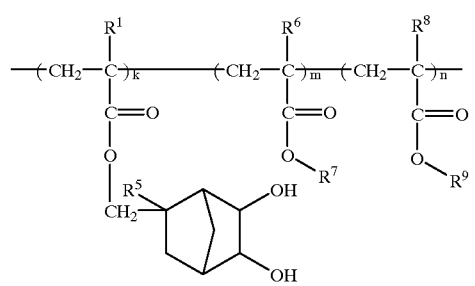
(8)

(in the general formula (8), $R^1$, $R^5$, $R^6$ and $R^8$ each independently represents a hydrogen atom or a methyl group; $R^7$ represents a bridged cyclic hydrocarbon group having 7 to 13 carbon atoms, which has a carboxyl group; $R^9$ represents a hydrogen atom, a hydrocarbon group having 1 to 12 carbon atoms, or a hydrocarbon group having 2 to 12 carbon atoms, which has a hydroxyl group; k, m and n each represents a composition ratio of each unit and is a number satisfying the expressions k+m+n=1, 0<k≦1, 0≦m<1 and 0≦n<1; and a weight-average molecular weight of the polymer is from 2000 to 200000).

5. The negative photoresist composition according to claim 1, wherein the crosslinking agent is at least one of compounds represented by the general formulas (9) to (12):

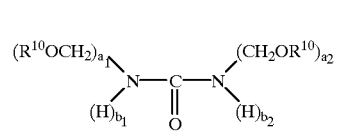
(9)

(in the general formula (9), $R^{10}$ represents a hydrogen atom, an alkyl group having 1 to 6 carbon atoms, or an oxoalkyl group having 3 to 6 carbon atoms; $a_1$ is 1 or 2; $a_2$ is 1 or 2; $b_1$ is 0 or 1; and $b_2$ is 0 or 1; with the proviso that $a_1+b_1=2$, $a_2+b_2=2$);

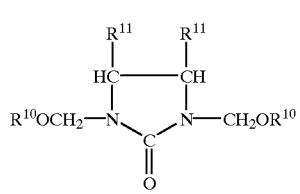
(10)

(in the general formula (10), $R^{10}$ represents a hydrogen atom, an alkyl group having 1 to 6 carbon atoms, or an oxoalkyl group having 3 to 6 carbon atoms; and $R^{11}$ represents a hydrogen atom, a hydroxyl group, an alkoxy group having 1 to 6 carbon atoms, or an oxoalkyloxy group having 3 to 6 carbon atoms);

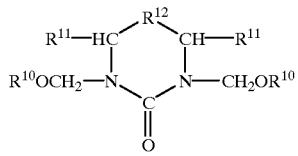

(11)

(in the general formula (11), $R^{10}$ represents a hydrogen atom, an alkyl group having 1 to 6 carbon atoms, or an oxoalkyl group having 3 to 6 carbon atoms; $R^{11}$ represents a hydrogen atom, a hydroxyl group, an alkoxy group having 1 to 6 carbon atoms, or an oxoalkyloxy group having 3 to 6 carbon atoms; and $R^{12}$ represents an oxygen atom, a sulfur atom, an alkylene group having 1 to 3 carbon atoms, or a hydroxymethylene group); and

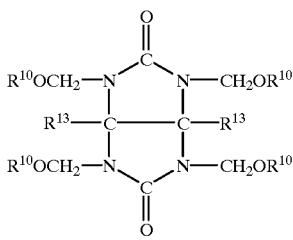

(12)

(in the general formula (12), $R^{10}$ represents a hydrogen atom, an alkyl group having 1 to 6 carbon atoms, or an oxoalkyl group having 3 to 6 carbon atoms; and $R^{13}$ represents a hydrogen atom or a methyl group).

6. The negative photoresist composition according to claim 1, wherein the crosslinking agent is a compound represented by the formula (13):

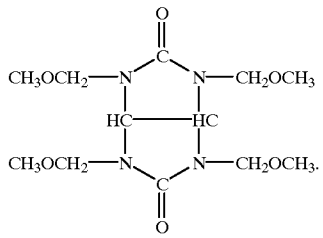

(13)

7. The negative photoresist composition according to claim 1, wherein the photo-acid generating agent is at least one of a sulfonium salt compound represented by the general formula (14), an iodonium salt compound represented by the general formula (16), am imide compound represented by the general formula (17) and a diazo compound represented by the general formula (18):

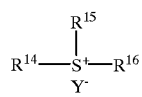

(14)

[in the general formula (14), $R^{14}$, $R^{15}$ and $R^{16}$ each independently represents an alkyl-substituted, halogen-substituted or non-substituted aromatic group, an alicyclic group, a bridged cyclic hydrocarbon group, a 2-oxo alicyclic group or an alkyl group; and $Y^-$ represents $BF_4^-$, $AsF_6^-$, $SbF_6^-$ or a counter ion represented by the formula (15): $Z—SO_3^-$ (in the formula (15), Z represents $C_nF_{2n+1}$ (n is an integer of 1 to 6), an alkyl group, or an alkyl-substituted, halogen-substituted or non-substituted aromatic group)];

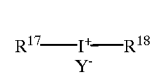

(16)

[in the general formula (16), $R^{17}$ and $R^{18}$ each independently represents an alkyl-substituted, halogen-substituted or non-substituted aromatic group, an alicyclic group, a bridged cyclic hydrocarbon group, a 2-oxo alicyclic group or an alkyl group; and $Y^-$ represents $BF_4^-$, $AsF_6^-$, $SbF_6^-$ or a counter ion represented by the above formula (15)];

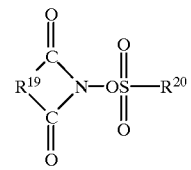

(17)

[in the general formula (17), $R^{19}$ represents a halogen-substituted or non-substituted alkylene group, or an alkyl-substituted, halogen-substituted or non-substituted divalent aromatic group; and $R^{20}$ represents a halogen-substituted or non-substituted alkyl group, an alkyl group, or a halogen-substituted or non-substituted aromatic group]; and

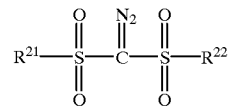

(18)

[in the general formula (18), $R^{21}$ and $R^{22}$ each independently an alkyl group, an alkyl-substituted, halogen-substituted or non-substituted aromatic group, an alkyl group, an alicyclic hydrocarbon group or a bridged cyclic hydrocarbon group].

8. The negative photoresist composition according to claim 1, comprising 50–98 parts by weight of the polymer, 1–50 parts by weight of the crosslinking agent and 0.2–15 parts by weight of the photo-acid generating agent capable of generating an acid by exposure.

9. A process for making a resist pattern, which comprises the steps of forming a layer containing the negative photoresist composition of claim 1 on a substrate to be worked; exposing the layer to light having a wavelength of 180 to 220 nm according to a desired pattern; baking the exposed one; and developing the baked one, thereby to remove the non-exposed portion from the substrate to be worked.

10. The process for forming a resist pattern according to claim 9, wherein light having a wavelength of 180 to 220 nm is ArF excimer laser beam.

* * * * *